United States Patent
Kumar et al.

(10) Patent No.: US 7,210,859 B2
(45) Date of Patent: *May 1, 2007

(54) OPTOELECTRONIC COMPONENTS WITH MULTI-LAYER FEEDTHROUGH STRUCTURE

(75) Inventors: Dev E. Kumar, San Jose, CA (US); Stefano Schiaffino, Menlo Park, CA (US); Giorgio Giaretta, Mountain View, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/979,466

(22) Filed: Nov. 2, 2004

(65) Prior Publication Data

US 2005/0089280 A1  Apr. 28, 2005

Related U.S. Application Data

(63) Continuation of application No. 10/625,022, filed on Jul. 23, 2003, now Pat. No. 6,867,368, and a continuation-in-part of application No. 10/231,395, filed on Aug. 29, 2002, now Pat. No. 6,703,561, which is a continuation-in-part of application No. 10/077,067, filed on Feb. 14, 2002, now Pat. No. 6,586,678.

(60) Provisional application No. 60/477,868, filed on Jun. 12, 2003.

(51) Int. Cl.
*G02B 6/36* (2006.01)
(52) U.S. Cl. ............................................. 385/88; 385/92
(58) Field of Classification Search ............... 174/52.5; 361/752, 809; 257/698; 385/88, 92
See application file for complete search history.

(56) References Cited

U.S. PATENT DOCUMENTS

| 3,987,676 | A | 10/1976 | Bennewitz |
| 4,128,697 | A | 12/1978 | Simpson |
| 4,375,578 | A | 3/1983 | Mitchell et al. |
| 4,769,684 | A * | 9/1988 | Crocker et al. ............... 257/99 |
| 4,818,099 | A * | 4/1989 | Preikschat et al. ......... 356/5.05 |
| 5,212,345 | A * | 5/1993 | Gutierrez .................. 174/52.5 |
| 5,545,846 | A * | 8/1996 | Williams et al. .............. 174/51 |
| 6,118,072 | A | 9/2000 | Scott |
| 6,439,918 | B1 | 8/2002 | Togami et al. |
| 6,521,989 | B2 * | 2/2003 | Zhou ........................ 257/698 |
| 6,586,678 | B1 | 7/2003 | Rosenberg et al. |
| 6,703,561 | B1 | 3/2004 | Rosenberg et al. |
| 6,734,658 | B1 | 5/2004 | Bierer |
| 7,053,472 | B2 * | 5/2006 | Mou et al. .................. 257/680 |
| 7,061,949 | B1 * | 6/2006 | Zhou et al. .................. 372/36 |
| 2003/0197254 | A1 * | 10/2003 | Huang ........................ 257/678 |
| 2004/0090620 | A1 * | 5/2004 | Farr ........................... 356/222 |

OTHER PUBLICATIONS

Setsuko Murata and Kazutoshi Mishimura Improvement in Thermal Properties of a Multi-Beam Laser Diode Array Aug. 1989.
Murata, S., Nishimura, K., *Improvement in Thermal Properties of a Multi-Beam Laser Diode Array*, Japanese Journal of Applied Physics, vol. 28, Suppl. 28-3, pp. 165-170 (1989).

* cited by examiner

*Primary Examiner*—Hung V. Ngo
(74) *Attorney, Agent, or Firm*—Workman Nydegger

(57) ABSTRACT

This disclosure concerns a platform suitable for use in connection with optoelectronic components and devices. In one example, the platform includes multiple stacked platform layers. A conductive pathway of the platform is supported by at least one of the stacked platform layers, and the conductive pathway is configured and arranged so as to be at least partly coextensive with the platform.

20 Claims, 22 Drawing Sheets

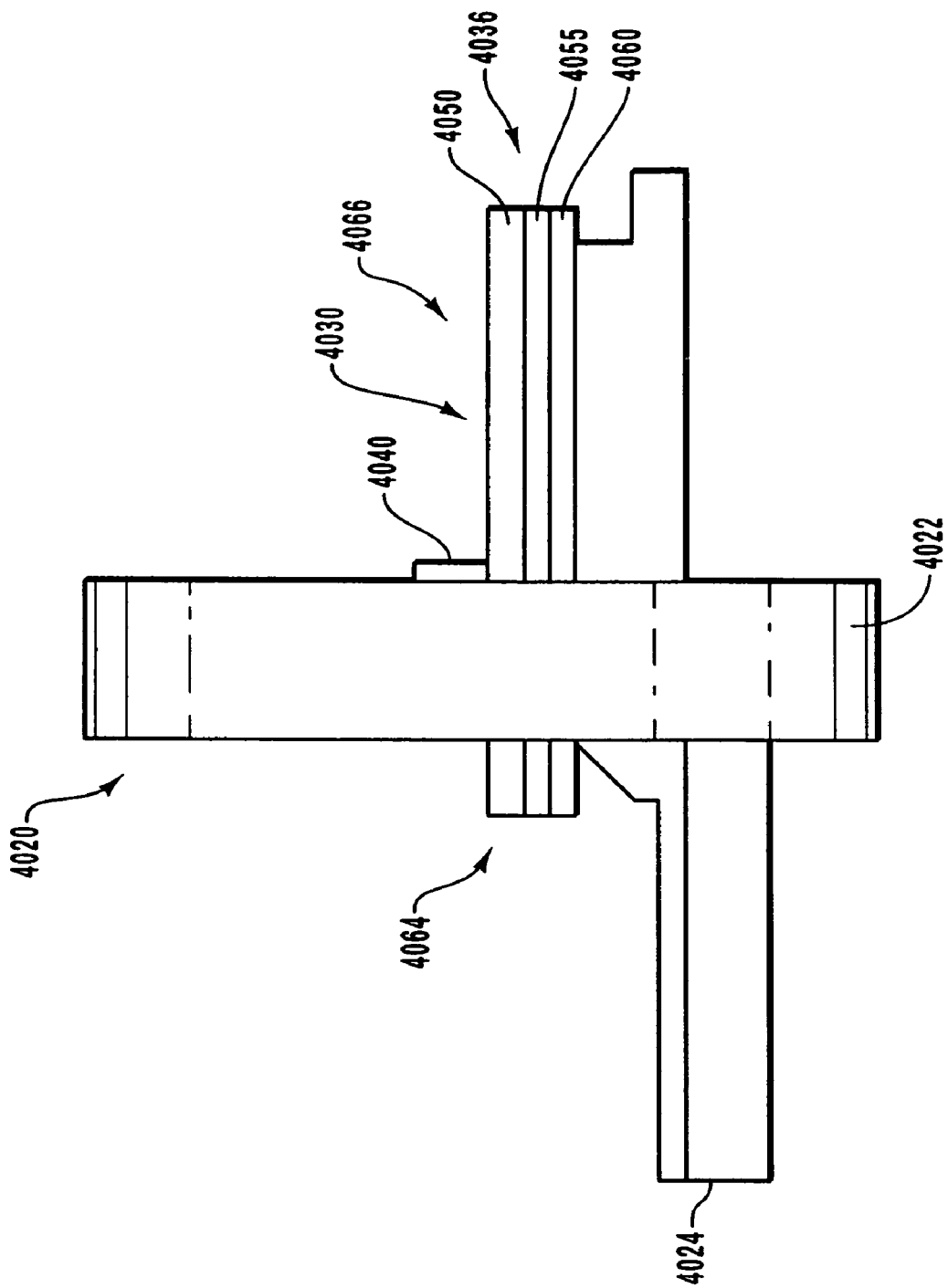

OPTOELECTRONIC COMPONENTS WITH MULTI-LAYER FEEDTHROUGH STRUCTURE

CROSS-REFERENCE TO RELATED APPLICATIONS

This application is a continuation, and claims the benefit, of U.S. patent application Ser. No. 10/625,022, entitled MULTI-LAYER CERAMIC FEEDTHROUGH STRUCTURE IN A TRANSMITTER OPTICAL SUBASSEMBLY, filed Jul. 23, 2003 now U.S. Pat. No. 6,867,368 (the "'022 Application") which, in turn, claims the benefit of U.S. Provisional Application No. 60/477,868, filed Jun. 12, 2003. The '022 Application is also a continuation-in-part of application Ser. No. 10/231,395, filed Aug. 29, 2002, now U.S. Pat. No. 6,703,561, which is a continuation-in-part of application Ser. No. 10/077,067, filed Feb. 14, 2002, now U.S. Pat. No. 6,586,678, entitled "CERAMIC HEADER ASSEMBLY." All of the foregoing applications are incorporated herein in their respective entireties by this reference.

BACKGROUND OF THE INVENTION

1. Field of the Invention

This invention is generally concerned with the field of optoelectronic systems and devices. More specifically, embodiments of the present invention relate to a transistor header that includes various features directed to the enhancement of the reliability and performance of various electronic devices, such as lasers, included in the transistor header.

2. Related Technology

Fiber-optic and opto-electronics have become important components in modern networking circuits. Using fiber-optic circuits allows for efficient, accurate and quick transmission of data between various components in a network system.

As with the design of most any system, there are engineering tradeoffs that often have to be made when implementing fiber optic systems. For example, the size and modularity of components must often be balanced against the need for additional space to accommodate heat dissipation and circuit monitoring components. While it is desirable to minimize a component's size, some configurations have previously limited this minimization due to their inherent characteristics. For example, previously many lasers used in fiber-optic systems that have the characteristics needed for long-distance transmission and/or dense wavelength division multiplexing (DWDM) generated amounts of heat that could not be dissipated by some smaller package sizes. Further, smaller package sizes have a limited amount of space available for mounting and connecting additional components such as thermistors, monitor photodiodes, thermoelectric coolers, or impedance matching circuits.

Regarding smaller package sizes, it is desirable in fiber optic systems to use modular components so that a system can be created in a compact area and with as little expensive customization as possible. For example, many fiber optic systems are able to use modular transceiver modules. The modular transceiver modules include an input receiver optical subassembly (ROSA) and an output transmitter optical subassembly (TOSA). The ROSA comprises a photodiode for detecting optical signals and sensing circuitry for converting the optical signals to digital signals compatible with other network components. The TOSA comprises a laser for transmitting optical signals and control circuitry for modulating the laser according to an input digital data signal. The TOSA has an optical lens for collimating the light signals from the laser of the TOSA to an optical fiber. Additionally, the transceiver module includes pluggable receptacles for optically connecting the TOSA and the ROSA with other components within a fiber optic network.

The transceiver module often includes an electronic connector for connection to electrical components of the computer or communication device with which the transceiver module operates (a "host system"). The design of the transceiver, as well as other components within the fiber optic system, is standards-based, such that components can be connected without significant customization.

One particular pluggable standard that is currently being developed is the 10-Gigabit Small Form-factor Pluggable (XFP) standard. This standard defines various characteristics such as size, power consumption, connector configuration, etc. With regards to power consumption, the XFP standard references three power consumption levels of 1.5 W, 2.5 W and 3.5 W. When designing devices to operate within the XFP standard, attention must be given to what components are selected and how they are configured so as to not exceed the rated power consumption. These devices are constrained by principles of semiconductor physics to work preferentially in a certain temperature range. The module power dissipation and the package size and materials uniquely determine the module operating temperature for given ambient conditions, such as ambient temperature, airflow, etc. The resulting module operating temperature determines the types of optical and electronic components that can be successfully operated within the package. One such package is known as a transistor-outline header, otherwise known as a TO can or TO.

Transistor-outline headers are widely used in the field of opto-electronics, and may be employed in a variety of applications. As an example, transistor headers are sometimes used to protect sensitive electrical devices, and to electrically connect such devices to components such as printed circuit boards ("PCB").

With respect to their construction, transistor headers often consist of a cylindrical metallic base with a number of conductive leads extending completely through, and generally perpendicular to, the base. With regard to the metallic base, the size of the base is often sized to fit within a specific TO standard size and lead configuration, examples of which include a TO-5 or TO-46. The leads are hermetically sealed in the base to provide mechanical and environmental protection for the components contained in the TO package, and to electrically isolate the conductive leads from the metallic material of the base. Typically, one of the conductive leads is a ground lead that may be electrically connected directly to the base.

Various types of devices are mounted on one side of the base of the header and connected to the leads. Generally, a cap is used to enclose the side of the base where such devices are mounted, so as to form a chamber that helps prevent contamination or damage to those device(s). The specific characteristics of the cap and header generally relate to the application and the particular device being mounted on the base of the header. By way of example, in applications where an optical device is required to be mounted on the header, the cap is at least partially transparent so to allow an optical signal generated by the optical device to be transmitted from the TO package. These optical TO packages are also known as window cans.

Although transistor headers have proven useful, typical configurations nevertheless pose a variety of unresolved problems. Some of such problems relate specifically to the physical configuration and disposition of the conductive leads in the header base. As an example, various factors combine to compromise the ability to precisely control the electrical impedance of the glass/metal feedthrough, that is, the physical bond between the conductive lead and the header base material. One such factor is that there are a relatively limited number of available choices with respect to the diameter of the conductive leads that are to be employed. Further, the range of dielectric values of the sealing glass typically employed in these configurations is relatively small. And, with respect to the disposition of the conductive leads, it has proven relatively difficult in some instances to control the position of the lead with respect to the through hole in the header base.

Yet other problems in the field concern those complex electrical and electronic devices that require many isolated electrical connections to function properly. Typically, attributes such as the size and shape of such devices and their subcomponents are sharply constrained by various form factors, other dimensional requirements, and space limitations within the device. Consistent with such form factors, dimensional requirements, and space limitations, the diameter of a typical header is relatively small and, correspondingly, the number of leads that can be disposed in the base of the header, sometimes referred to as the input/output ("I/O") density, is relatively small as well.

Thus, while the diameter of the header base, and thus the I/O density, may be increased to the extent necessary to ensure conformance with the electrical connection requirements of the associated device, the increase in base diameter is sharply limited, if not foreclosed completely, by the form factors, dimensional requirements, and space limitations associated with the device wherein the transistor header is to be employed.

A related problem with many transistor headers concerns the implications that a relatively small number of conductive leads have with respect to the overall performance of the device and the need to connect additional circuitry required by certain types of laser when the transistor header is used. Semiconductor lasers circuits operate more efficiently when the circuit driving the semiconductor laser has an impedance that is equal to the impedance of the laser itself. There is a special need for impedance matching and load balancing when circuits are operating at relatively high frequencies, such as is the case in many semiconductor laser communication circuits. Mismatched circuits may cause transmission line reflections and a corresponding inability to maximize the power delivered to the semiconductor laser. Additionally, transmission line reflections can cause intensity noise and phase noise that results in transmission penalties in the fiber-optic circuit. Impedance matching is often accomplished through the use of additional electrical components such as resistors, capacitors, inductors, and transmission lines such as microstrips, striplines, or coplanar waveguides. However, such components cannot be employed unless a sufficient number of conductive leads are available in the transistor header. Thus, the limited number of conductive leads present in typical transistor headers has a direct negative effect on the performance of the semiconductor laser or other device.

In connection with the foregoing, another aspect of many transistor headers that forecloses the use of, for example, components required for impedance matching, is the relatively limited physical space available on standard headers. In particular, the relatively small amount of space on the base of the header imposes a practical limit on the number of components that may be mounted thereon. To overcome that limit, some or all of any additional components desired to be used must instead be mounted on the printed circuit board, some distance away from the laser or other device contained within the transistor header. Such arrangements are not without their shortcomings however, as the performance of active devices in the transistor header, such as lasers and integrated circuits, depends to some extent on the physical proximity of related electrical and electronic components. By minimizing the distance between the lasers and integrated circuits to the additional components required for impedance matching, the inherent transmission line between such components is minimized. As such, placing the components in close physical proximity reduces reflective transmission line losses.

Even when a sufficient number of contacts are available to connect external components to the laser for impedance matching, other problems arise. For example, one of the simplest methods of impedance matching is by shunting a resistive impedance across the laser source wherein the shunting impedance matches the impedance of the laser. The problem with this solution is that it adds an additional load to the power supply where the additional load is the shunt resistor and thus wastes power and generates heat.

In one example, suppose that a laser has a 25 ohm load impedance and a laser driver has a 12.5 ohm source impedance. To match the laser impedance, a 25 ohm resistor is shunted across the laser. This results in a 12.5 ohm load for the laser driver that, while impedance matched, requires more power to drive than if the laser driver only needed to drive a 25 ohm load. One way to eliminate the need for external components is to create an appropriately designed transmission line that transmits the laser signal from the laser driver to the laser itself, with proper characteristic impedance to match the laser and the laser driver. In this way, the laser driver efficiently supplies power to the 25 ohm load while minimizing harmful reflections. Such transmission lines are often appropriately sized microstrips, striplines, or coplanar waveguides, etc., formed on a printed circuit board using the characteristics of the conductive materials on the circuit board and the substrate on which the conductive materials are placed. As such, whereas transistor headers do not have internal printed circuit boards available, such matching transmissions lines cannot be constructed.

In addition to the need for matching circuits, there is also often a need for other additional circuitry. For example, an externally modulated laser (EML) comprises a laser and a semiconductor modulator. Examples of lasers that can be used with EMLs include a distributed feedback (DFB) laser or a distributed Bragg reflector (DBR) laser. Examples of modulators include an electroabsorptive modulator, in which the modulator absorbs light depending on a control voltage, or various interferometric modulators, such as the Mach-Zehnder modulator, often made with lithium niobate. An eternally modulated laser having an electroabsorptive modulator can be referred to as an EA EML (electroabsorptive externally modulated laser). The integrated modulator has additional connections that require control signals from devices external to the transistor header that are normally not required when a laser without the integrated modulator is included. As such, without additional connections, lasers, such as EMLs, cannot be implemented in current transistor header designs.

The problems associated with various typical transistor headers are not, however, limited solely to geometric considerations and limitations. Yet other problems relate to the heat generated by components within, and external to, the transistor header. Specifically, transistor headers and their associated subcomponents may generate significant heat during operation. It is generally necessary to reliably and efficiently remove such heat to optimize performance and extend the useful life of the device.

However, transistor headers are often composed primarily of materials, Kovar® for example, that are not particularly good thermal conductors, but are instead selected for their properties of minimum thermal expansion and contraction, to match glass-metal seals and guarantee hermeticity. Such poor thermal conductivity does little to alleviate heat buildup problems in the transistor header components and may, in fact, exacerbate such problems. Various cooling techniques and devices have been employed in an effort to address this problem, but with only limited success. Such cooling problems have limited the types of lasers that may be used in transistor header applications. Particularly, such cooling problems have presented significant barriers to using lasers that are adapted for long-range fiber-optic communications such as externally modulated lasers (EMLs) that generate significant amounts of heat.

One drawback of using an EML is the heat that is generated by such a laser. Typically, most EMLs are operated between 25° C. to 30° C. As such, external cooling has commonly been required to pump heat away from the EML to maintain the laser at an appropriate operating temperature. The need for cooling components has previously imposed a limitation on the size of packages into which an EML is integrated. Further, because of the need for active cooling, the power consumption of a device integrating an EML is often greater than that allowed by many of the smaller package size standards such as XFP. Previously, EMLs have not been effectively integrated into smaller packages because of these cooling requirements. Additionally, in order to keep a laser's wavelength stable to enable such applications as DWDM, the temperature must be finely controlled to be fixed regardless of varying ambient temperatures and conditions. One of the best methods to accomplish this temperature control is to have precise control of the same cooler that is used to keep the laser at an appropriate operating temperature.

Solid state heat exchangers may be used to remove some heat from transistor header components. However, the effectiveness of such heat exchangers is typically compromised because, due to variables such as their configuration and/or physical location relative to the primary component(s) to be cooled, such heat exchangers frequently experience a passive heat load that is imposed by secondary components or transistor header structures not generally intended to be cooled by the heat exchanger. The imposition on the heat exchanger of such passive heat loads thus decreases the amount of heat the heat exchanger can effectively remove from the primary component that is desired to be cooled, thereby compromising the performance of the primary component.

As suggested above, the physical location of the heat exchanger or other cooling device has various implications with respect to the performance of the components employed present in the transistor header. One particular problem in the context of thermoelectric cooler ("TEC") type heat exchangers arises because TECs have hot and cold junctions. The cold junction, in particular, can cause condensation if the TEC is located in a sufficiently humid environment. Such condensation may materially impair the operation of components in the transistor header, and elsewhere.

Solid state coolers, such as TECs, are intrinsically very inefficient devices. State-of-the-art coolers have efficiencies measured in single or low double digits. Thus, the power consumption becomes astronomical when an attempt is made to cool lasers in packages that have significant thermal leaks. This process requires large amounts of power, which is inappropriate for small devices because it causes large temperature rises and because it is not permitted under standards, such as the XFP standard.

Another concern with respect to heat exchangers is that the dimensions of typical transistor headers are, as noted earlier, constrained by various factors. Thus, while the passive heat load placed on a heat exchanger could be at least partly offset through the use of a relatively larger heat exchanger, the diametric and other constraints imposed on transistor headers by form factor requirements and other considerations place practical limits on the maximum size of the heat exchanger.

Finally, even if a relatively large heat exchanger could be employed in an attempt to offset the effects of passive heat loads, large heat exchangers present problems in cases where the heat exchanger, such as a TEC, is used to modify the performance of transistor header components such as lasers. For example, by virtue of their relatively large thermal mass or load, such heat exchangers are not well suited to implementing the rapid changes in laser performance that are required in many applications, because such large heat exchangers cannot transfer the heat rapidly enough. Moreover, the performance of the laser or other component may be further compromised if the heat exchanger is located relatively far away from the laser because the thermal resistance is proportional to the distance between the component and the heat exchanger.

In light of the above discussion, a need exists for a transistor header design for use within an optical transceiver module that overcomes the above challenges. In particular, a transistor header is needed that enables a relatively greater number of interconnects to be established between the header interior and devices located outside of the header. Such a solution should also enable the use of components heretofore unimplemented in current header designs, such as EML laser configurations and thermo-electric coolers.

BRIEF SUMMARY OF AN EXEMPLARY EMBODIMENT OF THE INVENTION

In general, embodiments of the invention are concerned with a platform suitable for use in connection with optoelectronic components and devices. In one exemplary embodiment, the platform includes multiple stacked platform layers. A conductive pathway of the platform is supported by at least one of the stacked platform layers, and the conductive pathway is configured and arranged so as to be at least partly coextensive with the platform.

These and other aspects of exemplary embodiments of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 11B is a side view of the header assembly of FIG. 11A;

DETAILED DESCRIPTION OF EXEMPLARY EMBODIMENTS OF THE INVENTION

Reference will now be made to figures wherein like structures will be provided with like reference designations. It is understood that the drawings are diagrammatic and schematic representations of presently preferred embodiments of the invention, and are not limiting of the present invention nor are they necessarily drawn to scale.

FIGS. 1–16 depict various features of embodiments of the present invention, which is generally directed to an improved header assembly that permits enhanced functionality of components disposed therein. In particular, various embodiments of the present invention disclose a multi-layer feedthrough structure that is integrated with the header assembly for use in small form factor optical transceiver modules. The multi-layer configuration of the feedthrough enables a significant expansion of both the number and types of optoelectronic components that can be positioned within the header assembly. Examples of such components that can be utilized include EML and various other types of lasers, monitor photodiodes, and thermoelectric coolers.

In presently preferred embodiments the header assembly of the present invention is configured for use within optical transceiver modules adhering to the XFP standard. At the time of the filing of this patent application, the XFP standard is the XFP Adopted Revision 3.1, promulgated by the 10 Gigabit Small Form Factor Pluggable (XFP) Multi Source Agreement (MSA) Group. This XFP Adopted Revision 3.1 document is incorporated herein by reference. As used herein, the terms "XFP standard" and "XFP Multi Source Agreement" refer to the Adopted Revision 3.1. These terms also refer to any subsequent drafts or final agreements to the extent that any such subsequent drafts or final agreements are compatible with Adopted Revision 3.1.

1. Header Assemblies

Figure 1A:
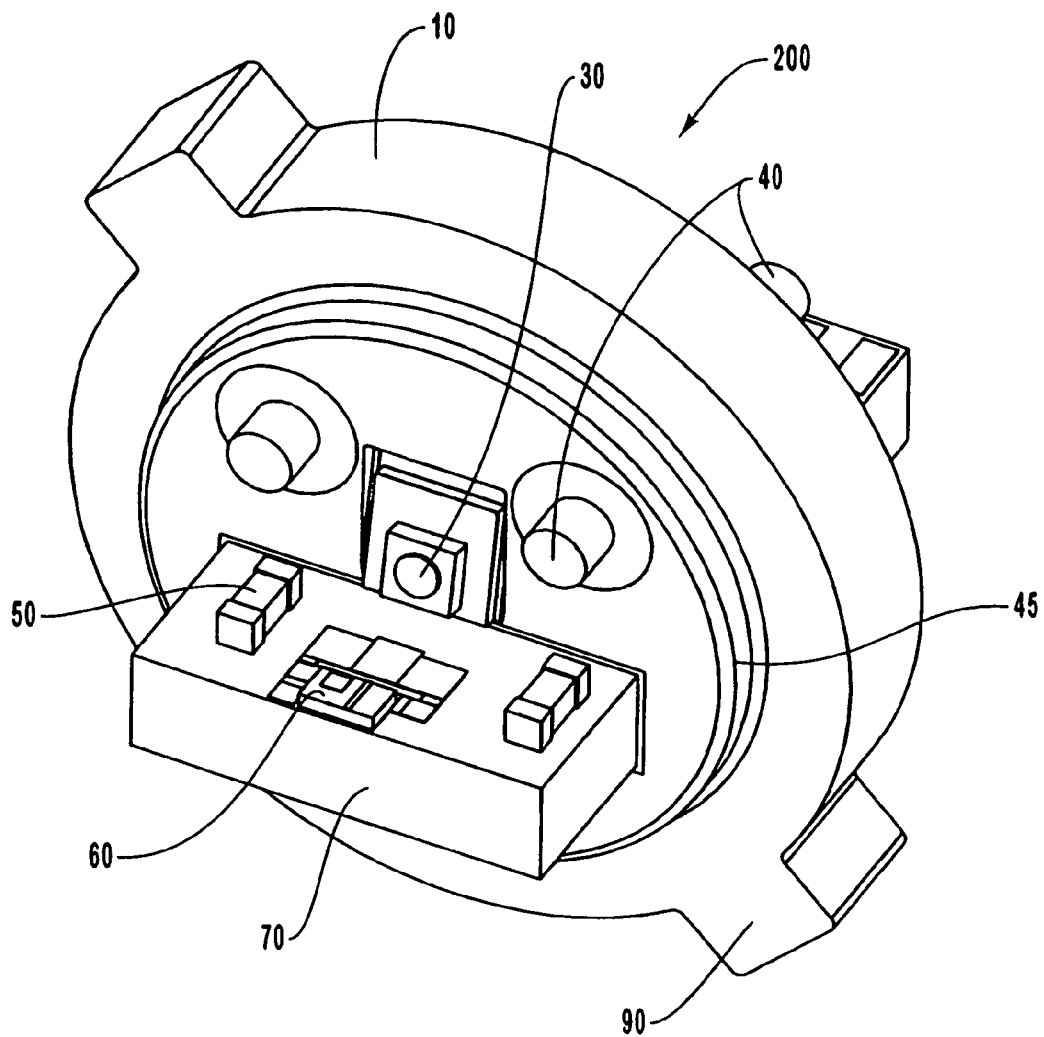
FIG. 1A is a perspective view illustrating various aspects of the device side of an exemplary embodiment of a header assembly.
Figure 1B:
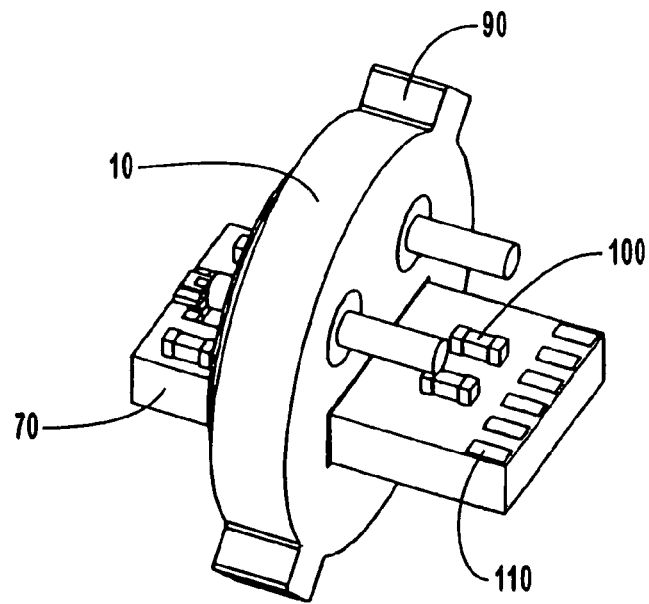
FIG. 1B is a perspective view illustrating various aspects of the connector side of an exemplary embodiment of a header assembly.

Reference is first made to FIGS. 1A and 1B together, which illustrate perspective views of one presently preferred embodiment of a header assembly, designated generally at 200. In the illustrated example, the header assembly 200 includes a substantially cylindrical metallic base 10. The base 10 includes two flanges 90 for releasably securing the header 200 to a receptacle (not shown) on a higher level opto-mechanical assembly. The base can be formed of Alloy 42, which is an iron nickel alloy, as well as cold-rolled steel, Vacon VCF-25 Alloy, or Kovar. The base 10 also includes a ceramic platform 70 extending perpendicularly through the base as shown. The ceramic platform is hermetically sealed to the base to provide mechanical and environmental protection for the components contained in the TO package. Ceramic materials may include alumina ($Al_2O_3$) or aluminum nitride (AlN).

The hermetic seal between the base 10 and the platform 70 is created by electrically insulating glass-to-metal seals. Alternatively, the platform 70 may incorporate two additional ceramic outer layers to electrically isolate the outer-most conductors. In this second case, a metal braze or solder can be used to hermetically seal the platform 70 to the metal base. This solution overcomes the principal shortcomings of glasses, namely their low strength, brittleness, and low thermal conductivity.

The platform 70 is structured to house multiple electrical components 50 and 100, and active devices 60 on either side of the base. In the illustrated embodiment, the active device 60 comprises a semiconductor laser, and the components 50 and 100 may include resistors, capacitors, and inductors that are used to balance the driving impedance of the laser with the component impedance. As discussed in more detail below, impedance matching circuits may also be created by etching electrical traces that have various capacitive, inductive or resistive properties, on platform 70. In addition to matching, components may have peripheral functions such as measuring temperature, sensing laser optical power or wavelength, etc. As it is important for a semiconductor laser to be precisely positioned perpendicularly to the base 10, platform 70 is, therefore, precisely positioned perpendicularly with respect to the base 10.

Where active device 60 comprises a semiconductor laser, a small deviation in the position of active device 60, in relation to base 10 can cause a large deviation in the direction of the emitted laser beam. Accurate perpendicularity between the platform and the base can be achieved by incorporating a vertical pedestal feature in the base material, as shown on FIG. 1A. The vertical pedestal houses the photodiode 30 in the embodiment shown in FIG. 1A. Such feature can be machined, stamped, or metal injection molded directly with the base thus providing a stable and geometrically accurate surface for mating with the platform.

The platform 70 further includes multiple electrically isolated conductive pathways 110 extending throughout the platform 70 and consequently through the base 10. The conductive pathways 110 provide the electrical connections necessary between electrical devices or components located throughout the platform 70. The conductive pathways 110 form a connector on that side of the base that does not include the semiconductor laser 60, also referred to herein as the "connector side" of the base. Note in connection with the foregoing that the side of the base where the active device 60 is located may in some instances be referred to herein as the "device side" of the base.

The connector formed by the conductive pathways 110 is used to electrically connect the header assembly 200 to a second electrical subassembly, such as a printed circuit board, either directly (for example, by solder connection) or indirectly by an intermediary device such as a flexible printed circuit. The semiconductor laser 60 is electrically connected to the electrical components 50 and 100 via the conductive pathways 110.

The platform 70 may also comprise multiple layers wherein each layer may have a conductive layer with various conductive pathways 110. In this way numerous conductive pathways 110 may be constructed for use with various components disposed on the platform 70. Generally, the layers are electrically isolated from one another, however various conductive pathways 110 on different layers may be connected by a via such as is commonly known in printed circuit board arts.

Further, the conductive pathways 110 can be shaped and placed such that they have controlled capacitive, inductive, or resistive effects to create waveguides such as a microstrip or stripline (cpw, etc.). For example, knowing certain characteristics about the materials used in making the conductive pathways 110 and the materials of the various layers of the platform 70, passive electrical devices can be constructed by appropriately configuring the conductive pathways 110. In this way, a transmission line with known characteristics can be created for use with active devices 60 attached to the platform 70. As noted above, by matching the characteristics of the transmission line connected to active devices 60 with the active devices' 60 load impedance, electrical reflections that cause transmission errors and lower power output can be reduced or in many cases eliminated.

By constructing a transmission line that matches active device 60 impedance on the platform 70 from the conductive traces 110, the need to add additional discrete matching components is eliminated often resulting in better overall circuit performance. In fact, previously due to the lack of adequate matching circuits, applications involving transistor headers have been limited to 10 Gb/s. With the improvements of using a transmission line constructed on the platform 70, applications up to 40 Gb/s or more can be implemented.

While the preceding description has discussed active devices 60 in terms of lasers, it should be noted that the transmission lines may also be formed such that a matching circuit for other semiconductor devices is constructed. For example, the transmission lines may be used to connect directly to a laser, such as in the case of DFB lasers. Alternately, the transmission lines may be used to connect to an EA modulator, for example, such as in the case of EMLs that incorporate a DFB laser and an EA modulator. As discussed herein, the impedance values of the impedance matching transmission lines depend on the load impedance of the active devices attached to the platform 70.

External components, while still useful, are not ideal for impedance matching because they often represent an additional load that must be driven by the power supply driving the electronic component, such as when resistors are used to match the active device 60 load impedance. Additionally, although the external components may be placed reasonably close to the active devices 60, there is always some small distance between the external components and the active devices 60 that acts as an unmatched transmission line.

The use of advanced ceramic materials, examples of which include aluminum nitride and beryllia, allows the header assembly 200 to achieve substantially lower thermal resistances between the devices inside the package and the outside world where heat is ultimately transferred. As discussed in further detail below in the context of an alternative embodiment of the invention, a cooling device, such as a thermoelectric cooler ("TEC"), a heat pipe or a metal heat spreader, can be mounted directly on the platform, thereby providing for a very short thermal path between the temperature sensitive devices on the platform and a heat sink located outside the header assembly.

As is further shown in FIGS. 1A and 1B, the header assembly 200 additionally includes two conductive leads 40 extending through and out both sides of the base 10. The conductive leads 40 are hermetically sealed to the base 10 to provide mechanical and environmental protection for the components contained in the TO package between the conductive leads 40 and the base 10. The hermetic seal between the conductive leads 40 and the base 10 is created, for example, by glass or other comparable hermetic insulating materials that are known in the art. The conductive leads 40 can also be used to electrically connect devices and/or components located on opposite sides of the base.

In the illustrated embodiment at least, the conductive leads 40 extend out from the side of the base 10 that does not contain the semiconductor laser 60, in a manner that allows for the electrical connection of the header assembly 200 with a specific header receptacle located on, for example, a printed circuit board. It is important to note that conductive pathways 110 and conductive leads 40 perform the same function and that the number of potential conductive pathways 110 is far greater than the potential number of conductive leads 40. Alternative embodiments can incorporate even more conductive pathways 110 than shown in the illustrated embodiment.

The platform 70 further includes steps and recessed areas that permit mounting devices with various thicknesses flush with the metal pads on the ceramic. This allows the use of the shortest electrical interconnects, wire bonds for example, having improved electrical performance and characteristics. This also provides optical benefits by, for example, aligning the active region of a laser mounted on the platform with the optical axis of the package.

The photodiode 30 is used to detect the signal strength of the semiconductor laser 60 and relay this information back to control circuitry of the semiconductor laser 60. In the illustrated embodiment, the photodiode can be directly connected to the conductive leads 40. Alternatively, the photodiode can be mounted directly onto the same platform as the laser, in a recessed position with respect to the light emitting area. This recessed position allows the photodiode to capture a fraction of the light emitted by the laser, thus allowing the photodiode to perform the same monitoring function.

This configuration of the monitoring photodiode allows for eliminating the need of conductive leads 40, and lends itself to simplified electrical connections, such as wire bonds, to the conductive pathways 110 of the platform 70. In an alternative embodiment, the photodiode light gathering can be increased by positioning an optical element on the base for focusing or redirecting light, such as a mirror, or by directly shaping and/or coating the base metal to focus additional light onto the photodiode.

As is further shown in FIG. 1A, the base 10 includes a protruding portion 45 that is configured to releasably position or locate a cap (not shown) over one side of the base 10. A cap can be placed over the side of the base 10 containing the semiconductor laser 60 for the purpose of protecting the semiconductor laser 60 from potentially destructive particles. A transparent cap is preferable for the illustrated embodiment so as to allow the laser light to escape the region between the cap and the base 10.

Figure 2A:
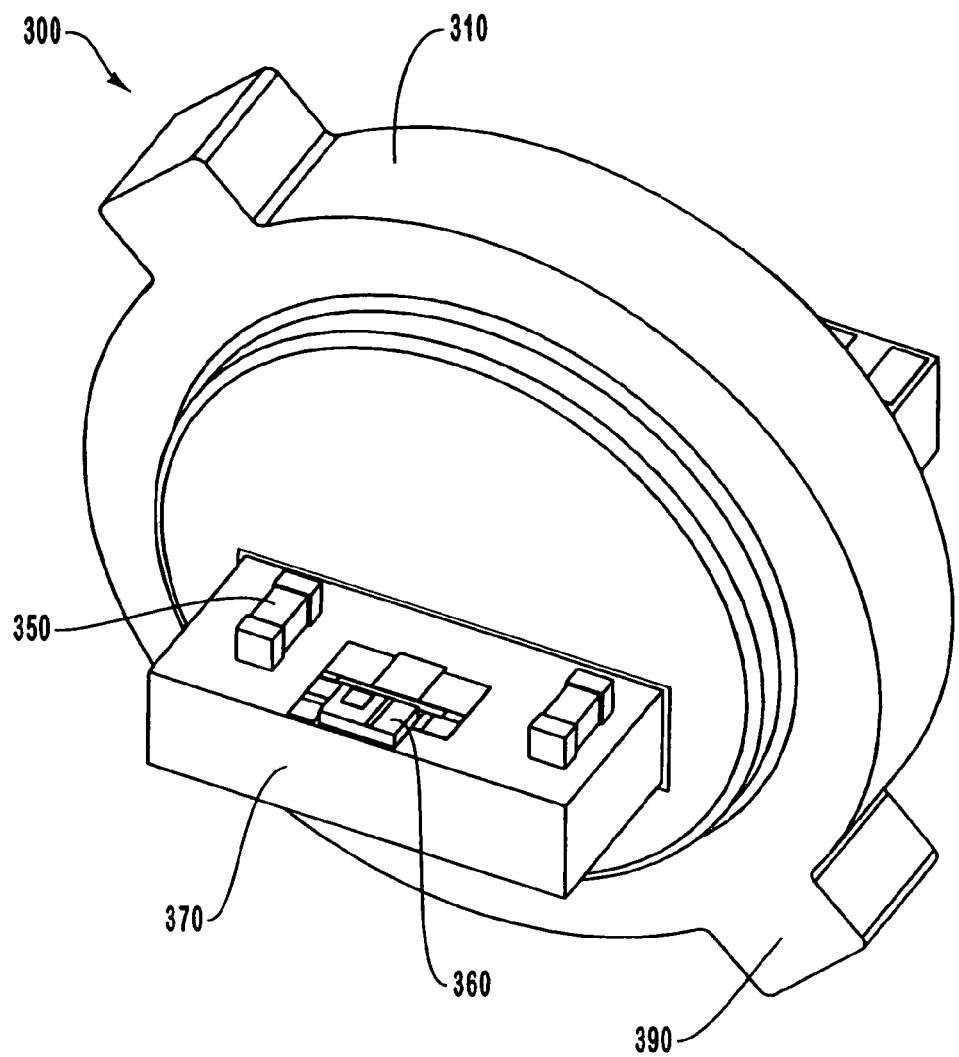
FIG. 2A is a perspective view illustrating various aspects of the device side of an alternative embodiment of a header assembly.
Figure 2B:
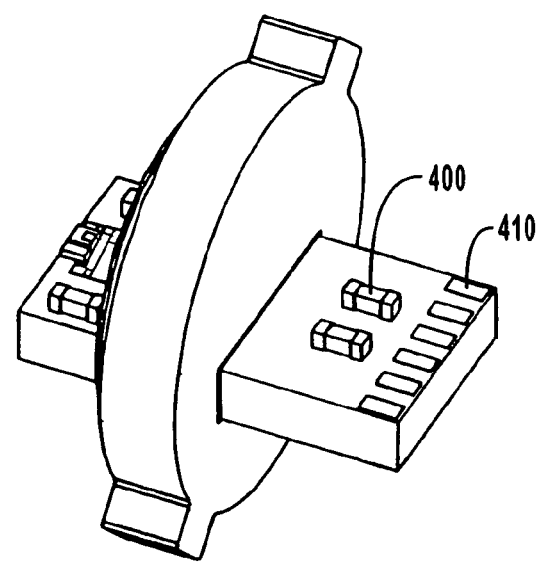
FIG. 2B is a perspective view illustrating various aspects of the connector side of an alternative embodiment of a header assembly.

Reference is next made to FIGS. 2A and 2B, which illustrate perspective views of an alternative embodiment of a header assembly, designated generally at 300. This alternative embodiment shows an optical receiver 360 mounted horizontally on the platform 370 perpendicularly bisecting the base 310 of the header assembly 300. The optical receiver can be a photodetector or any other device capable of receiving optical signals. The optical receiver 360 is mounted flat on the platform 370 and detects light signals through the side facing away from the base 310. This type of optical receiver is sometimes referred to as an "edge detecting" detector. The base 310 and platform 370 are described in more detail with reference to FIGS. 1A and 1B. The platform 370 contains electrical components 350, 400 on either side of the base for operating the optical receiver 360. The platform 370 also includes conductive pathways 410 for electrically connecting devices or components on either side of the base 310. This embodiment of a header assembly does not contain conductive leads and therefore all electrical connections are made via the conductive pathways 410.

Figure 3A:
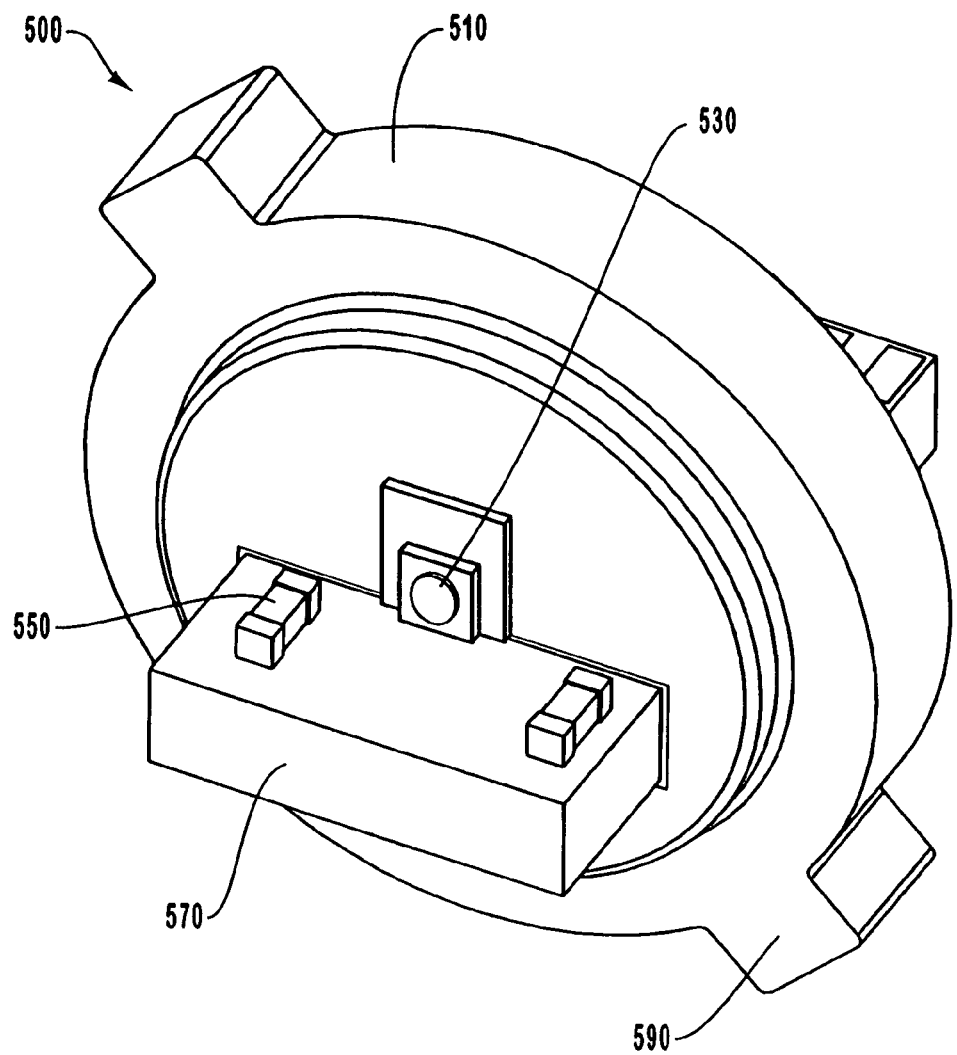
FIG. 3A is a perspective view illustrating various aspects of the device side of another alternative embodiment of a header assembly.
Figure 3B:
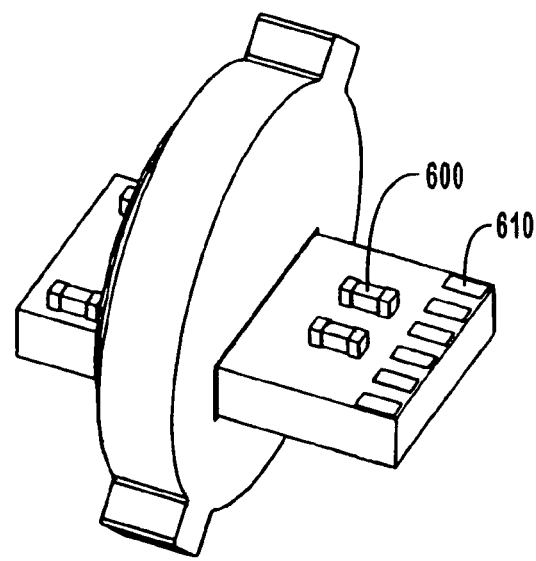
FIG. 3B is a perspective view illustrating various aspects of the connector side of another alternative embodiment of a header assembly.

Reference is next made to FIGS. 3A and 3B, which illustrate perspective views of yet another alternative embodiment of a header assembly, designated generally at 500. This alternative embodiment also shows an optical receiver 530 mounted vertically on the base 510. The optical receiver can be a photodetector or any other device capable of receiving optical signals. This is an optical receiver 530 which detects light signals from the top of the device. The base 510 and platform 570 are described in more detail with reference to FIGS. 1A and 1B. The platform 570 contains electrical components 550, 600 on either side of the base for operating the optical receiver 530. The platform 570 also includes conductive pathways 510 for electrically connecting devices or components on either side of the base 510. This embodiment of a header assembly does not contain conductive leads and therefore all electrical connections are made via the conductive pathways 410.

In other embodiments of the invention, the optical receiver 360 or optical receiver 530 is an avalanche photodiode (APD). Generally, APDs represent a good choice for an optical receiver because they have good noise and gain characteristics. Specifically, the wide gain bandwidth product of APDs allows for more versatility in design such that noise can be reduced and transmission distances increased. Unlike the transmitter designs disclosed herein, these receivers often include active semiconductor integrated circuits mounted next to the receiver pin diode or APD, generally in the form of a transimpedance amplifier (TIA) or a TIA with a limiting amplifier (TIALA).

2. Thermoelectric Coolers Used with Header Assemblies

Directing attention now to FIGS. 4A through 4D, various aspects of an alternative embodiment of a header assembly, generally designated at 700, are illustrated. The embodiment of the header assembly illustrated in FIGS. 4A through 4D is similar in many regards to one or more of the embodiments of the header assembly illustrated in FIGS. 1A through 3B. Accordingly, the discussions of FIGS. 4A through 4D will focus primarily on certain selected aspects of the header assembly 700 illustrated there. Note that in one embodiment of the invention, header assembly 700 comprises a transistor header. However, header assembly 700 is not limited solely to that exemplary embodiment.

As indicated in FIGS. 4A through 4D, header assembly 700 generally includes a base 702 through which a platform 800 passes. The platform 800 is configured to receive a cooling device 900 upon which various devices and circuitry are mounted. Note that while it may be referred to herein as a "cooling" device 900, the cooling device 900 may, depending upon its type and the application where it is employed, serves both to heat and/or cool various components and devices. Finally, a cap 704 mounted to, and cooperating with, base 702, serves to define a hermetic chamber 706 (FIG. 4E), which encloses cooling device 900 and the mounted devices and circuitry.

As discussed in further detail below, a variety of means may be employed to perform the functions disclosed herein, of a cooling device. Thus, the embodiments of the cooling device disclosed and discussed herein are but exemplary structures that function as a means for transferring heat. Accordingly, it should be understood that such structural configurations are presented herein solely by way of example and should not be construed as limiting the scope of the present invention in any way. Rather, any other structure or combination of structures effective in implementing the functionality disclosed herein may likewise be employed.

Figure 4A:
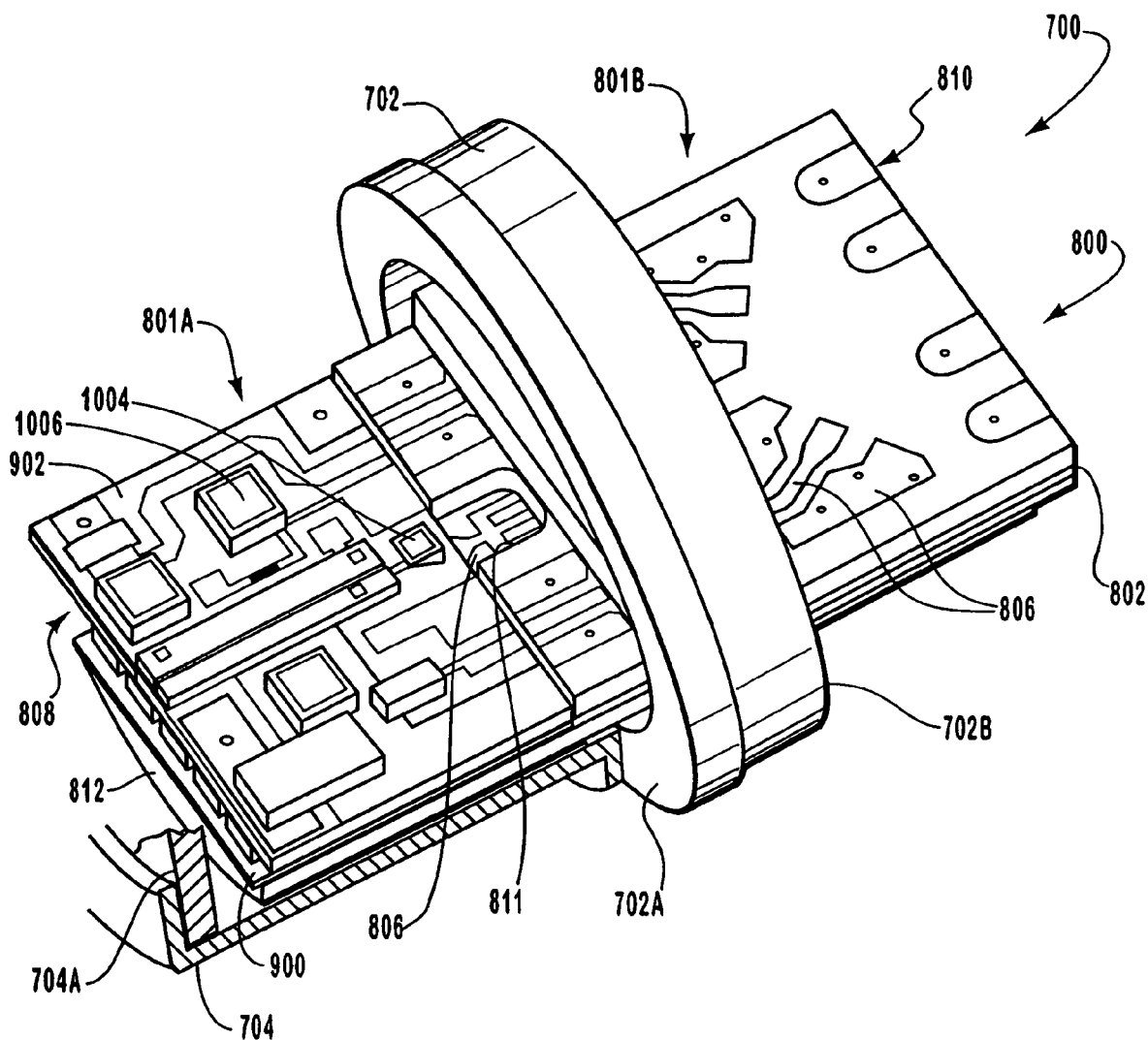
FIG. 4A is a top perspective view of an exemplary embodiment of a header including active devices mounted on a TEC disposed within a hermetic chamber.
Figure 4B:
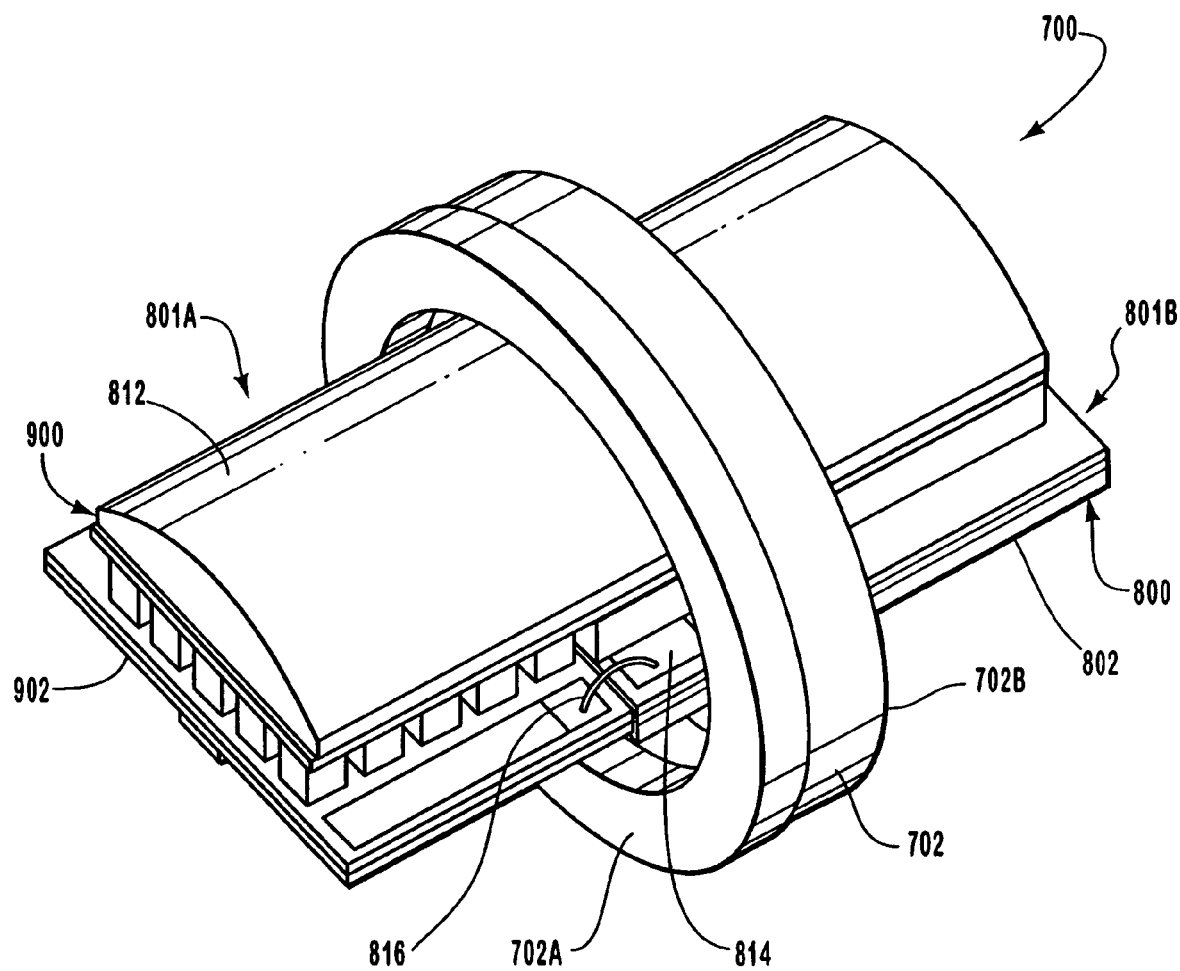
FIG. 4B is a bottom perspective view of the exemplary embodiment illustrated in FIG. 4A.
Figure 4C:
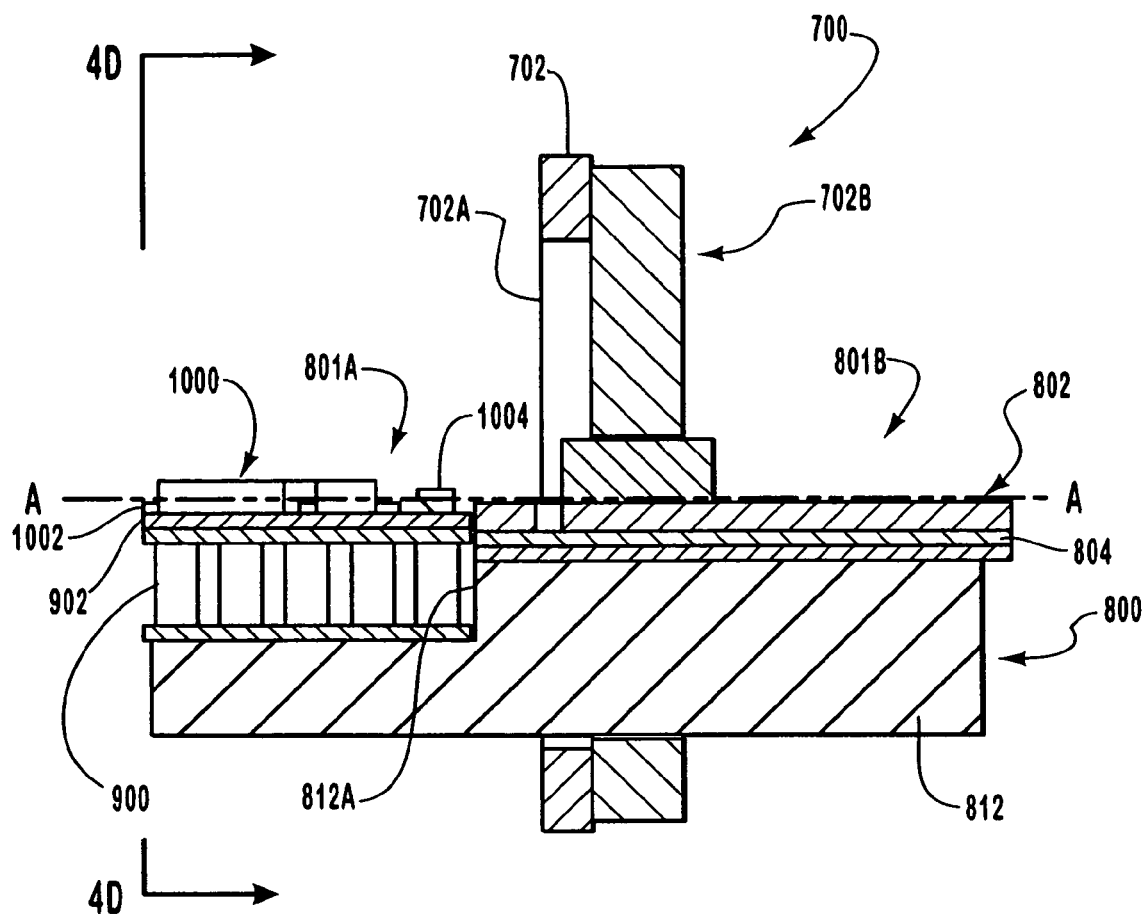
FIG. 4C is a cross-section view illustrating various aspects of the exemplary embodiment presented in FIGS. 4A and 4B.
Figure 4D:
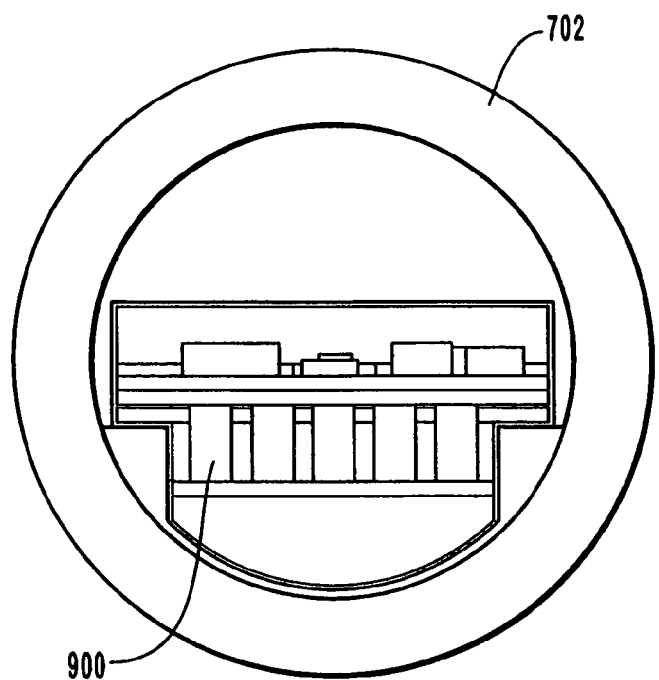
FIG. 4D is a cross-section view taken along line 4D—4D of FIG. 4C and illustrates various aspects of an exemplary arrangement of a TEC in a header assembly.

With continuing attention to FIGS. 4A and 4B, and directing attention also to FIGS. 4C and 4D, further details are provided concerning various aspects of platform 800. In the illustrated embodiment, platform 800 is disposed substantially perpendicularly with respect to base 702. In particular, base 702 includes a device side 702A and a connector side 702B, and platform 800 passes completely through base 702, so that an inside portion 801A of platform 800 is disposed on device side 702A of base 700 and outside portion 801B of platform 800 is disposed on connector side 702B of base 702. However, this arrangement of platform 800 is exemplary only, and various other arrangements of platform 800 may alternatively be employed consistent with the requirements of a particular application.

In the illustrated embodiment, platform 800 includes a first feedthrough 802 having a multi-layer construction that includes one or more layers 804 of conductive pathways 806. (see FIG. 4A). In general, conductive pathways 806 permit electrical communication among the various components and devices (removed for clarity) disposed on platform 800, while also permitting such components and devices to electrically communicate with other components and devices that are not a part of platform 800. Moreover, conductive pathways 806 cooperate to form a connector 810 situated on the outside portion 801B of platform 800, on the connector side 702B of base 700. In general, connector 810 facilitates electrical communication between header assembly 700 and other components and devices such as, but not limited to, printed circuit boards (see FIG. 4E). In one embodiment, connector 810 comprises an edge connector, but any other form of connector may alternatively be used, consistent with the requirements of a particular application. As discussed in further detail below, first feedthrough 802 may include cutouts 811 or other geometric features which permit direct access to, and electrical connection with, one or more conductive pathways 806 disposed on an inner layer of first feedthrough 802.

In addition to the first feedthrough 802, platform 800 further includes a second feedthrough 812 to which the first feedthrough 802 is attached. Note that in the exemplary illustrated embodiment, first feedthrough 810, with the exception of conductive pathways 806, often is formed from a ceramic material that is generally resistant to heat conduction. However, other ceramic materials, such as AlN, are conductive of heat and can be used to assist in the transfer of heat out of the package. Second feedthrough 812 in the illustrated embodiment comprises a material that is generally useful as a heat conductor, such as a metal. Copper and copper alloys, such as CuW, are examples of metals that are suitable in some applications. Thus, platform 800 is generally configured to combine heat conductive elements with non-heat conductive elements so as to produce a desired effect or result concerning the device wherein platform 800 is employed.

In connection with the foregoing, it should be noted further that ceramics and metals are exemplary materials only and any other material or combination thereof that will facilitate implementation of the functionality disclosed herein may alternatively be employed. Moreover, other embodiments of the invention may employ different arrangements and numbers of, for example, conductive and non-conductive feedthroughs, or feedthroughs having other desirable characteristics. Accordingly, the illustrated embodiments are exemplary only and should not be construed to limit the scope of the invention in any way.

With respect to their configurations, the geometry of both first feedthrough 802 and second feedthrough 812 may generally be configured as necessary to suit the requirements of a particular application or device. In the exemplary embodiment illustrated in FIGS. 4A through 4D, second feedthrough 812 incorporates a step 812A feature which serves to, among other things, provide support for cooling device 900 and, as discussed in further detail below, to ensure that devices mounted to cooling device 900 are situated at a desirable location and orientation. As further indicated in FIG. 4D, for example, second feedthrough 812 defines a semi-cylindrical bottom that generally conforms to the shape of cap 704 and contributes to the stability of cooling device 900, as well as providing a relatively large conductive mass that aids in heat conduction to and/or from, as applicable, cooling device 900 and other devices.

As suggested earlier, platform 800 also serves to provide support to cooling device 900. Directing renewed attention now to FIGS. 4A through 4D, details are provided concerning various aspects of cooling device 900. In particular, a cooling device 900 is provided that is mounted is directly to platform 800. In an exemplary embodiment, cooling device 900 comprises a thermoelectric cooler ("TEC") that relies for its operation and usefulness on the Peltier effect wherein electrical power supplied to the TEC may, according to the requirements of a particular application, cause selected portions of the TEC to generate heat and/or provide a cooling effect. Exemplary construction materials for the TEC may include, but are not limited to, bismuth telluride ($Bi_2Te_3$), and other such materials designed to maximize the thermo-electric effect. These materials are selected to have minimum thermal conductivity, since it is directly parasitic to the cooling/heating effect (one side gets cold, the other hot, and the device itself is a direct short). The platform 800 is highly thermally conductive, and can be formed from Cu or CuW.

Note that the TEC represents an exemplary configuration only, and various other types of cooling devices may alternatively be employed as required to suit the dictates of a particular application. By way of example, where active temperature control of one or more electronic devices 1000, aspects of which are discussed in more detail below, is not required, the TEC may be replaced with a thermally conductive spacer, laser control circuitry, laser power supply circuitry or other similar devices. Furthermore, a combination of devices may be placed into transistor header in the location showing the TEC in FIGS. 4A–4D.

In addition to providing heating and/or cooling functionality, cooling device 900 also includes a submount 902 that supports various electronic devices 1000 such as, but not limited to, resistors, capacitors, and inductors, as well as optical devices such as mirrors, lasers, and optical receivers. Thus, cooling device 900 is directly thermally coupled to electronic devices 1000.

In one exemplary embodiment, the electronic devices 1000 include a laser 1002, such as a semiconductor laser, or other optical signal source. With regard to devices such as laser 1002, at least, cooling device. 900 is positioned and configured to ensure that laser 1002 is maintained in a desired position and orientation. By way of example, in some embodiments of the invention, cooling device 900 is positioned so that an emitting surface of laser 102 is positioned at, and aligned with, a longitudinal axis A—A of header assembly 700 (FIG. 4C).

Note that although reference is made herein to the use of a laser 1002 in conjunction with cooling device 900, it should be understood that embodiments employing laser 1002 are exemplary only and that additional or alternative devices may likewise be employed. Accordingly, the scope of the invention should not be construed to be limited solely to lasers and laser applications.

In at least some of those embodiments where a laser 1002 is employed, a photodiode 1004 and thermistor 1006 (FIG. 4A) are also mounted on, or proximate to, submount 902 of cooling device 900. In general, photodiode 1004 is optically coupled with laser 1002 such that photodiode 1004 receives at least a portion of the light emitted by laser 1002, and thereby aids in gathering light intensity data concerning laser 1002 emissions. Further, thermistor 1006 is thermally coupled with laser 1002, thus permitting the gathering of data concerning the temperature of laser 1002. There may also be a wavelength locking circuit having two separate photodiodes with different wavelength-sensitive responses, which is known as a wavelocker.

In some embodiments, photodiode 1004 comprises a 45 degree monitor photodiode. The use of this type of diode permits the related components, such as laser 1002 and thermistor 1006 for example, to be mounted and wirebonded on the same surface. Typically, the 45 degree monitor diode is arranged so that light emitted from the back of laser 1002 is refracted on an inclined surface of the monitor diode and captured on a top sensitive surface of the monitor diode. In this way, the monitor diode is able to sense the intensity of the optical signal emitted by the laser.

Note that in those embodiments where a laser 1002 is employed, cap 704 includes an optically transparent portion, or window, 704A through which light signals generated by the laser 1002 are emitted. Similarly, in the event electronic device 1000 comprises other optical devices, such as an optical receiver, cap 704 would likewise include a window 704A so as to permit reception, by the optical receiver, of light signals. As suggested by the foregoing, the construction and configuration of cap 704 may generally be selected as required to suit the parameters of a particular application.

In view of the foregoing general discussion concerning various electronic devices 1000 that may be employed in conjunction with cooling device 900, further attention is directed now to certain aspects of the relation between such electronic devices 1000 and cooling device 900. In general, cooling device 900 may be employed to remove heat from, or add heat to, one or more of the electronic devices 1000, such as laser 1002, to achieve a desired effect. As discussed in further detail herein, the capability to add and remove heat, as necessary, from a device such as laser 1002, may be employed to control the performance of laser 1002, such as wavelength stability for DWDM applications In an exemplary embodiment, the heating and cooling, as applicable, of electronic devices 1000 is achieved with a cooling device 900 that comprises a TEC. Various aspects of the arrangement and disposition of electronic devices 1000, as well as cooling device 900, serve to enhance these ends. By way of example, because electronic devices 1000 are mounted directly to cooling device 900 results in a relatively short thermal path between electronic devices 1000 and cooling device 900. Generally, such a relatively shorter thermal path between components translates to a corresponding increase in the efficiency with which heat may be transferred between those components. Such a result is particularly useful where devices whose operation and performance is highly sensitive to heat and temperature changes, such as lasers, are concerned. Moreover, a relatively short thermal path also permits the transfer of heat to be implemented relatively more quickly than would otherwise be the case. Because heat transfer is implemented relatively quickly, this exemplary arrangement can be used to effectively and reliably maintain the temperature of laser 1002 or other devices.

Another aspect of at least some embodiments relates to the location of cooling device 900 relative, not just to electronic devices 1000, but to other components, devices, and structures of header assembly 700. In particular, because cooling device 900 is located so that the potential for heat transmission, whether radiative, conductive, or convective, from other components, devices, and structures of header assembly 700 to cooling device 900 is relatively limited, the passive heat load imposed on cooling device 900 by such other components and structures is relatively small. Note that, as contemplated herein, the "passive" heat load generally refers to heat transferred to cooling device 900 by structures and devices other than those upon which cooling device 900 is primarily intended to exert a heating and/or cooling effect. Thus, in this exemplary embodiment, "passive" heat loads refers to all heat loads imposed on cooling device 900 except for those heat loads imposed by electronic devices 1000.

The relative reduction in heat load experienced by cooling device 900 as a consequence of its location has a variety of implications. For example, the reduced heat load means that a relatively smaller cooling device 900 may be employed than would otherwise be the case. This is a desirable result, particularly in applications such as header assemblies where space may be limited. As another example, a relatively smaller cooling device 900, at least where cooling device 900 comprises a TEC, translates to a relative decrease in the amount of power required to operate cooling device 900. This effect is quite significant, since TECs are very inefficient. The power to effectively cool is much more than the load, so any reduction in load has a multiplicative benefit. Another consideration relating to the location of cooling device 900 concerns the performance of laser 1002 and the other electronic components 1000 disposed in hermetic chamber 706. In particular, the placement of cooling devices 900, such as TECs that include a "cold" connection, in hermetic chamber 706 substantially forecloses the occurrence of condensation, and the resulting damage to other components and devices of header assembly 700, caused by the cold connection, that might otherwise result if cooling device 900 were located outside hermetic chamber 706.

In addition to the heat transfer effects that may be achieved by way of the location of cooling device 900, and the relatively short thermal path that is defined between cooling device 900 and the electronic devices 1000 mounted to submount 902 of cooling device 900, yet other heat transfer effects may be realized by way of various modifications to the geometry of cooling device 900. In connection with the foregoing, it is generally the case that by increasing the size of cooling device 900, a relative increase in the capacity of cooling device 900 to process heat will be realized.

In this regard, it should be noted that it is the case in many applications that the diameter of base 702 is often constrained to fit within certain predetermined form factors or dimensional requirements and that such form factors and dimensional requirements, accordingly, have certain implications with respect to the geometric and dimensional configuration of cooling device 900.

By way of example, the diametric requirements placed on base 702 may serve to limit the overall height and width of cooling device 900 (see, e.g., FIG. 4D). In contrast however, the overall length of header assembly 700 is generally not so rigidly constrained. Accordingly, certain aspects of cooling device 900, such as its length for example, may desirably be adjusted to suit the requirements of a particular application. In the case of a TEC, for example, such a dimensional increase translates into a relative increase in the amount of heat that cooling device 900 can process. As noted earlier, such heat processing may include transmitting heat to, and/or removing heat from, one or more of the electronic components 1000, such as laser 1002.

Moreover, various dimensions and geometric aspects of cooling device 900 may be varied to achieve other thermal effects as well. By way of example, in the event cooling device 900 comprises a TEC, a relatively smaller cooling device 900 with a correspondingly low load and thermal mass will permit relatively quicker changes in the temperature of electronic devices 1000 mounted thereto. The low thermal mass of the load of the TEC enables rapid thermal servoing and thus high-bandwidth temperature control. In the case where electronic device 1000 comprises a laser, this capability is particularly desirable as it lends itself to control of laser performance through the vehicle of temperature adjustments.

Turning now to consideration of the power requirements for cooling device 900, at least where it comprises a TEC, and electronic devices 1000, it was suggested earlier herein that those devices typically rely for their operation on a supply of electrical power. Generally, the TEC must be electrically connected with platform 800 so that power for the operation of the TEC, transmitted from a power source (not shown) to platform 800, can be directed to the TEC. Additionally, power is supplied to electronic devices 1000 by way of platform 800, and electronic devices 1000 must, accordingly, be connected with one or more of the conductive pathways 806 of platform 800.

Figure 4E:
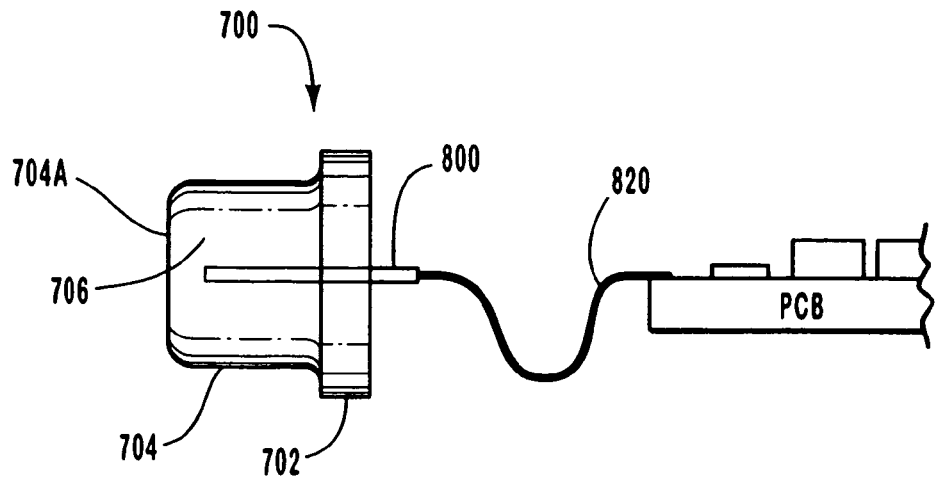
FIG. 4E is a side view illustrating aspects of an exemplary electrical connection scheme for the header assembly and a printed circuit board.

The foregoing electrical connections and configurations may be implemented in a variety of ways. Various aspects of exemplary connection schemes are illustrated in FIGS. 4A, 4B and 4E. With reference first to FIG. 4B, the underside of submount 902 of cooling device 900 is connected with conductive elements 814 disposed on the underside of first feedthrough 802, by way of connectors 816 such as, but not limited to, wire bonds. Such conductive elements 814 may be electrically connected with selected conductive pathways 806 (see FIG. 4A) and/or connector 810, that are ultimately connected with an electrical power source (not shown).

Directing attention next to FIG. 4A, details are provided concerning various aspects of the electrical connection of electronic devices 1000 disposed on submount 902. As noted earlier, and illustrated in FIG. 4A, some embodiments of platform 800 include one or more cutouts 811, or other geometric feature that, that permits direct connection of electronic devices 1000, such as laser 1002 to one or more conductive pathways 806 disposed within first feedthrough 802 of platform 800. This connection may be implemented by way of connectors 816, such as bond wires, or other appropriate structures or devices. In addition to the aforementioned connection, and as illustrated in FIG. 4E, at least some embodiments of the invention further include a flex circuit 820, or similar device, which serves to electrically interconnect platform 800 of header assembly 700 with another device, such as a printed circuit board.

With attention now to FIGS. 4A through 4D, details are provided concerning various operational aspects of header assembly 700. In general, power is provided to laser 1002 and/or other electrical components 1000 by way of connector 810, conductive pathways 806, and connectors 818. In response, laser 1002 emits an optical signal. Heat generated as a result of the operation of laser 1002, and/or other electronic components 1000, is continuously removed by cooling device 900, which comprises a TEC in at least those cases where a laser 1002 is employed in header assembly 700, and transferred to second feedthrough 812 upon which cooling device 900 is mounted. Ultimately, second feedthrough 812 transfers heat received from cooling device 900 out of header assembly 700.

Because cooling device 900 is disposed within hermetic chamber 706, the cold junction on cooling device 900, where it comprises a TEC, does not produce any undesirable condensation that could harm other components or devices of header assembly 700. Moreover, the substantial elimination of passive heat loads on cooling device 900, coupled with the definition of a relatively short thermal path between electronic components 1000, such as laser 1002, and cooling device 900, further enhances the efficiency with which heat can be removed from such electronic components and, accordingly, permits the use of relatively smaller cooling devices 900. And, as discussed earlier, the relatively small size of cooling device 900 translates to a relative decrease in the power required to operate cooling device. 900. Yet other operational aspects of embodiments of the invention are considered in further detail below in the context of the discussion of a laser control system.

Figure 4F:
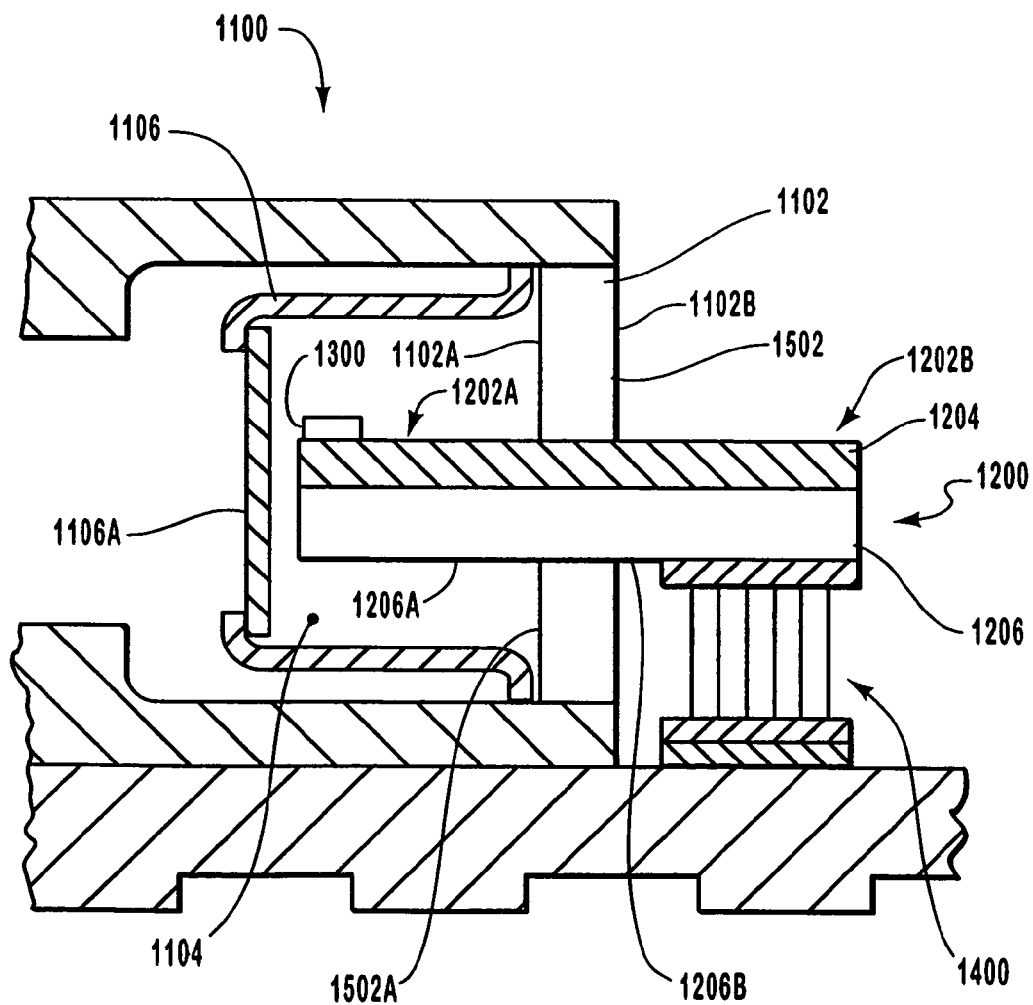
FIG. 4F illustrates various aspects of an alternative platform/TEC configuration where the TEC is located outside the hermetic chamber.

While, as noted earlier in connection with the discussion of FIGS. 4A through 4D, certain effects may be achieved by locating cooling device 900 within hermetic chamber 706, it is nevertheless desirable in some cases to locate the cooling device outside of the hermetic chamber. Aspects of an exemplary embodiment of such a configuration are illustrated in FIG. 4F, where an alternative embodiment of a header assembly is indicated generally at 1100. As the embodiment of the header assembly illustrated in FIG. 4F is similar in many regards to one or more of the embodiments of the header assembly discussed elsewhere herein, the discussion of FIG. 4F will focus primarily on certain selected aspects of the header assembly 1100 illustrated there.

Similar to other embodiments, header assembly 1100 includes a base 1102 having a device side 1102A and a connector side 1102B, through which a platform 1200 passes in a substantially perpendicular orientation. The platform 1200 includes an inside portion 1202A and an outside portion 1202B. One or more electronic devices 1300 are attached to inside portion 1202A of platform 1200 so as to be substantially enclosed within a hermetic chamber 1104 defined by a cap 1106 and base 1102. In the event that electronic device 1300 comprises an optical device, such as a laser, cap 1106 may further comprise an optically transparent portion, or window, 1106A to permit optical signals to be transmitted from and/or received by one or more electronic devices 1300 disposed within hermetic chamber 1104.

With continuing reference to FIG. 4F, platform 1200 further comprises a first feedthrough 1204, upon which electronic devices 1300 are mounted, joined to a second feedthrough 1206 that includes an inside portion 1206A and an outside portion 1206B. The outside portion 1206B of second feedthrough 1206 is, in turn, thermally coupled with a cooling device 1400. In the illustrated embodiment, cooling device 1400 comprises a TEC. However, other types of cooling devices may alternatively be employed.

In operation, heat generated by electronic devices 1300 is transferred, generally by conduction, to second feedthrough 1206. The heat is then removed from feedthrough. 1206 by way of cooling device 1400 which, in some embodiments, comprises a TEC. As in the case of other embodiments, a TEC may also be employed, if desired, to add heat to electronic devices 1300.

Thus positioned and arranged, cooling device 1400 is able not only to implement various thermal effects, such as heat removal or heat addition, with respect to electronic devices 1300 located inside or outside hermetic chamber 1104, but also operates to process passive heat loads, which may be conductive, convective and/or radiative in nature, imposed by various components such as the structural elements of header assembly 1500. As noted herein in the context of the discussion of various other embodiments, variables such as, but not limited to, the geometry, placement, and construction materials of platform 1200 and cooling device 1400 may be adjusted as necessary to suit the requirements of a particular application.

Further, by locating the cooling device 900 external to the hermetic chamber, additional space is available in the hermetic chamber for devices such as laser control circuits, laser power supplies, etc.

As suggested earlier, the cooling devices constructed and operated according to the invention may be usefully employed in the context of a laser control system. The laser control system includes a master control circuit, which may be a system that uses, for example, analog feedback or a digital microcontroller or microprocessor using A/D and D/A circuits The master control circuit directly controls two or, in some instances, three outputs. These outputs include the laser output irradiance and the TEC power (through a "power source" or TEC driver). It optionally, in the case of an EML, the master control circuit also controls modulator bias. Feedback to the control system is involves two, or in some instances, three inputs. These inputs include laser launch irradiance detected by means of a monitor photodiode (MPD), or back facet (BF) monitor and laser temperature detected by means of a thermistor or another temperature sensor. The inputs can also include wavelength detected by means of a wavelength locker, using two diodes or another suitable system. The sensors for measuring the inputs are in the header, while the bulk of the control circuit is on an external PCB.

Because the TEC facilitates the transfer of heat from the laser, the laser control system maintains the temperature of the laser below a critical value at which laser performance begins to degrade and reliability becomes an issue. In addition, embodiments of the laser control system of the invention also enable control of the temperature of the laser within a specified range independent of ambient temperature conditions, so as to achieve certain ends such as wavelength stabilization. This permits the laser to be used for a DWDM application, for example.

3. Externally Modulated Lasers Used with Header Assemblies

When designing a transistor header for implementation in a transceiver module, it is desirable to limit the power consumption of the module such that the power consumption is within the specification of a particular standard for which the transceiver is designed. For example, it may be desirable to limit the power consumption of the transceiver to 3.5 W or another specified value to comply with, for example, the XFP standard. This power consumption includes the power required to operate the active devices such as lasers and control circuitry and the power required to actively pump heat away from heat generating devices in the module. The active temperature control, using devices such as a TEC, effectively conducts heat from the active devices within the header so the heat can be dissipated outside of the header using passive cooling devices, such as heat sinks. To stay within the 3.5 W or other specified limits, the TEC or other active cooling system and the heat sinks or other passive cooling devices must cooperate to transfer the thermal energy from the laser, thereby actively controlling the temperature of the laser. The active temperature control provided by the TEC controls wavelength stability of the laser and can enable the operating temperature of the laser to be selected.

The ability to dissipate heat from an assembly utilizing a transistor header via a passive cooling device is dependant on several factors including the materials used in the assembly, the surface area of the materials at various points, the temperature at which the heat generating components operate and the ambient temperature in which the assembly operates. The factors can be summarized by the equation:

$$H = kA\frac{(T_o - T_a)}{L}$$

Where H is the amount of heat transferred, k is a material constant, A is a surface area, $T_o$ is the operating temperature of the transistor header assembly, $T_a$ is the ambient temperature in which the transistor header assembly is operated and L is the length of the passive cooling device. Thus, heat flow is dependant on the temperature differential between the ambient temperature and the operating temperature. As such, if all other factors are held constant, an increase in the operating temperature causes a greater amount of heat to be transferred through the passive cooling device.

In one embodiment of the invention using an EML, although other types of lasers and active devices may be used in similar embodiments, by operating the EML at 40° C., the passive cooling achieved by conducting the heat generated by the laser and other devices such as the laser driver to an external heat sink is increased as compared to operating the embodiment at 25° C. or 30° C. because the differential between the operating temperature and the ambient temperature is increased. Given a certain amount of power dissipation within a header, there is a certain amount of heat that must leave the header and be dissipated into the environment to reach thermal equilibrium. The thermal resistance of the thermal path then determines the temperature difference between the inside of the header and the ambient temperature, according to the equation above. Assuming an ambient environment of 25° C. or so, the laser, while operating, may get up to an idle temperature in the range of 45° C. to 50° C. without any active cooling because of this thermal resistance. If a TEC were used to cool the EML down nearly to the ambient temperature of 25° C., the inefficiencies of the TEC would require very large amounts of power. The power required to operate the TEC can be reduced by cooling the EML from the idle temperature of 45° C. to 50° C. to only 40° C. to 45° C. Thus, the amount of active temperature control that would otherwise be required can be reduced. Alternatively, the active temperature control may be located outside of the transistor header.

While this increase in operating temperature compared to an operating temperature of 25° C. has some effect on the wavelength of the laser beam transmitted by the EML (as well as other operating parameters), this effect can be counteracted by varying the current supplied to the EML or by adjusting the signal to the EML driver. In an alternative embodiment, the EML may be specifically optimized to operate efficiently at 40° C. This optimization can be done by adjusting the electro-absorption band-gap of the modulator when manufacturing the modulator.

Figure 5:
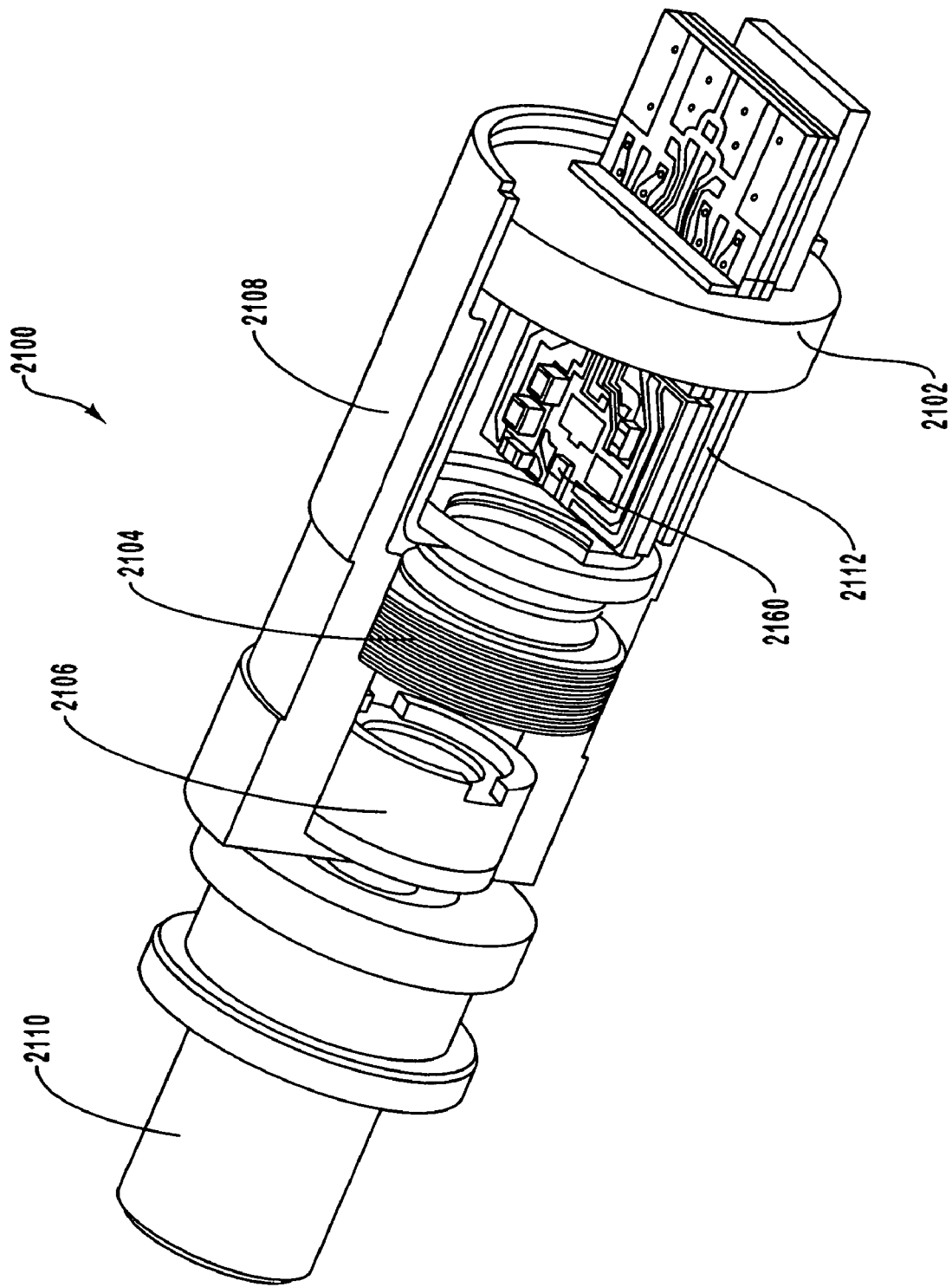
FIG. 5 is a perspective view of an exemplary transmitter optical subassembly with a transistor header assembly and an EML as well as optics, such as a lens, isolator, and a receptacle for an optical cable such as an LC cable.

Directing attention now to FIG. 5, the illustration shows an EML 2160 implemented in a transistor header 2102 wherein the transistor header 2102 is implemented in an optical subassembly 2100. The EML optical subassembly 2100 may be later installed in other components such as a pluggable transceiver module or any other suitable device. The EML optical subassembly 2100 incorporates a transistor header 2102 with a collimating lens assembly 2104, an isolator 2106, and a receptacle 2110.

The subassembly 2100 generally comprises an outer casing 2108 for containing or stabilizing the other components including the transistor header 2102, the collimating lens assembly 2104, the isolator 2106, and the receptacle 2110. The outer casing 2108 may be constructed of any suitable material, such as stainless steel.

In one embodiment of the invention, internal to the casing 2108 and disposed in the transistor header 2102 is a laser diode 2160. The laser diode 2160 may be any laser suitable for the particular application. For example, in a DWDM network, it may be desirable to use EMLs to take advantage of their narrow line width and low chirp values. In applications where precise wavelength control is not required, other types of lasers such as DFB lasers may be used. Alternatively, when the subassembly 2100 is intended to be used as a receiver, a photodiode such as an APD or pin diode or any other suitable diode may be used.

A collimating lens assembly 2104 is optically coupled to the laser diode 2160. The collimating lens assembly 2104 may be any suitable combination of lenses adapted to focus light from the laser diode 2160 such that the light can be further propagated in a fiber optic network. In a receiver application when a photo diode is used, the collimating lens assembly 2104 is adapted to focus light from the fiber optic network onto the photo diode.

The isolator 2106 is adapted to prevent back reflection of light into the laser diode 2160. Back-reflections are generally caused when light travels from a medium having a first index of refraction into a medium with a second, different index of refraction. Reflections back into a laser look like another cavity of the laser other than the primary, and destabilize the amplitude and wavelength of the laser light. Certain standards have been developed that specify acceptable amounts of back-reflection. For example, SONET specifications require that a receiver have a back-reflection ratio no greater than −27 dB. Other techniques can be used at the receiver to reduce optical return loss or back reflections, including a variety of index matching and anti-reflection techniques, such as a combination of fiber stubs, angle polished fibers or stubs, anti-reflection coatings, and glass plates.

A receptacle 2110 is optically coupled to the isolator 2106. The receptacle is adapted to couple to other fiber-optic device in a pluggable manner. In one embodiment of the invention, the receptacle complies with the XFP standard receptacle size for implementation in an XFP system, which is an LC fiber-optic cable receptacle. Other common receptacles are the SC and FC connectors.

Further disposed in the transistor header 2102 as described elsewhere above, is a TEC cooler 2112. Also as noted above, the TEC cooler may be removed or replaced with other types of circuits when the subassembly design allows for less cooling, or when there is no need for active wavelength stabilization in, for example, CWDM systems or systems that do not use wavelength division multiplexing.

As such, a transmitter optical subassembly utilizing lasers, such as EMLs not previously able to be used in pluggable applications, is effectively implemented. Such transmitter optical subassemblies can be further integrated into optical systems to create a modular optical transmission network with good bandwidth and transmission distance characteristics.

4. Multi-Layer Ceramic Feedthrough Structure

Figure 6:
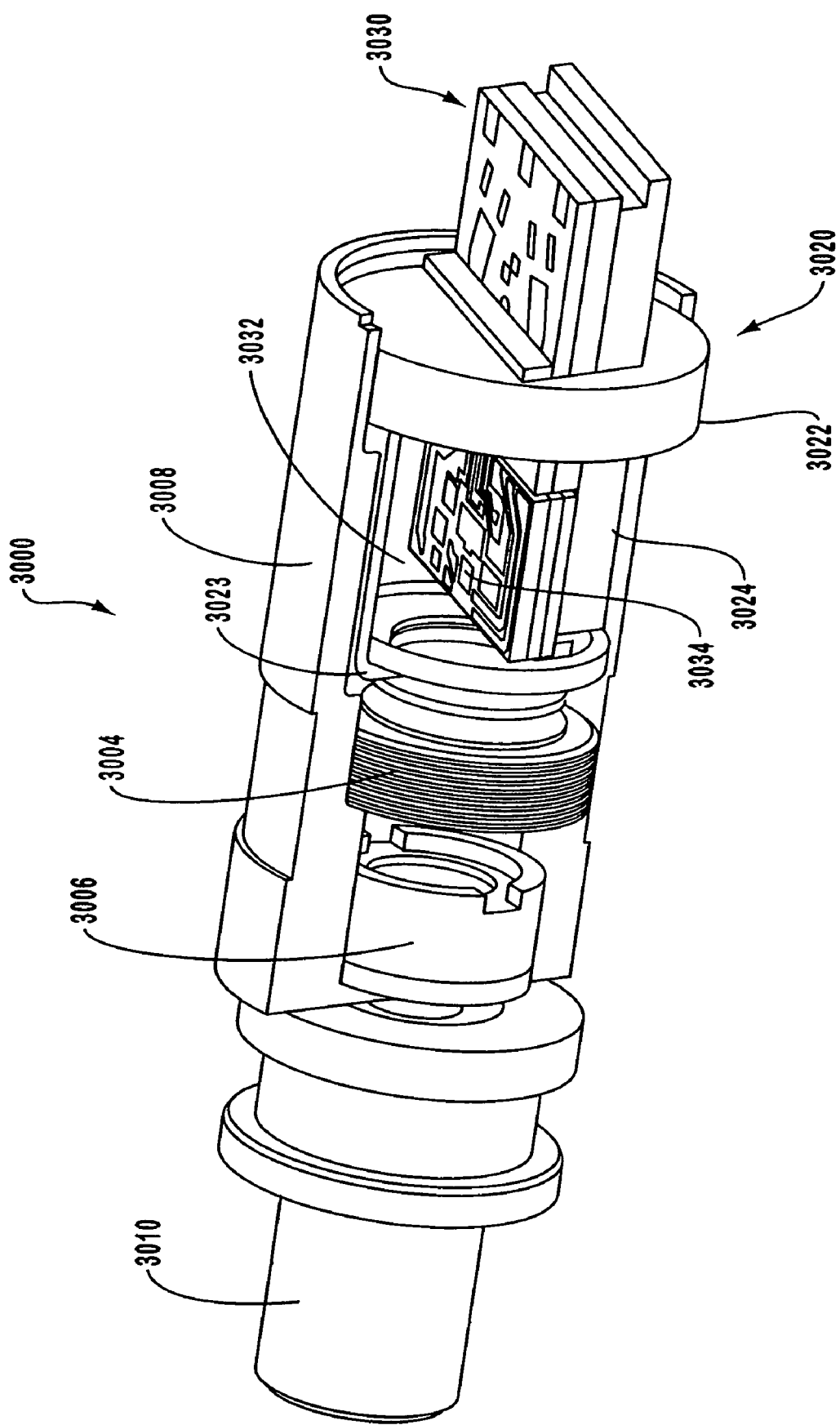
FIG. 6 is a perspective view of a transmitter optical subassembly having a header assembly configured in accordance with another embodiment of the present invention.

Reference is now made to FIG. 6, depicting various details of a transmitter optical subassembly ("TOSA") 3000. The TOSA 3000 as shown in FIG. 6 is configured for use within an optical transceiver module (not shown) that is capable of producing a modulated optical signal for transmission via an appropriate waveguide, such as a fiber optic cable. Such optical signals are used, for instance, in optical communications networks for high speed transmission of data, as has been discussed.

The TOSA 3000 comprises various components, many of which have already been described in connection with FIG. 5. Among these are a lens assembly 3004, an isolator 3006, an outer casing 3008, and a receptacle 3010. As various details concerning the TOSA 3000 and its components have been previously described in connection with previous figures, only selected features of the embodiments to follow will be discussed below.

The TOSA 3000 further includes a header assembly made in accordance with one embodiment of the present invention. As described in connection with previous embodiments, the header assembly, generally designated at 3020, provides multiple functions for the TOSA 3000. First, the header assembly 3020 serves as an interconnect that enables the transfer of electrical signals to and from components disposed within the TOSA 3000. (As used herein, the term "electrical signals" is meant to include at least electrical, electrostatic, and/or electromagnetic signals.) Additionally, the header assembly 3020 supports a component platform on which optoelectronic devices can be positioned. Further, and as already described in previous embodiments, the header assembly 3020 enables cooling and/or heating of specified TOSA components in order to optimize operation of components located on the component platform, as well as TOSA operation as a whole. Attention will now be directed to certain aspects of the header assembly 3020 in general, and specified components thereof in particular.

Figure 7A:
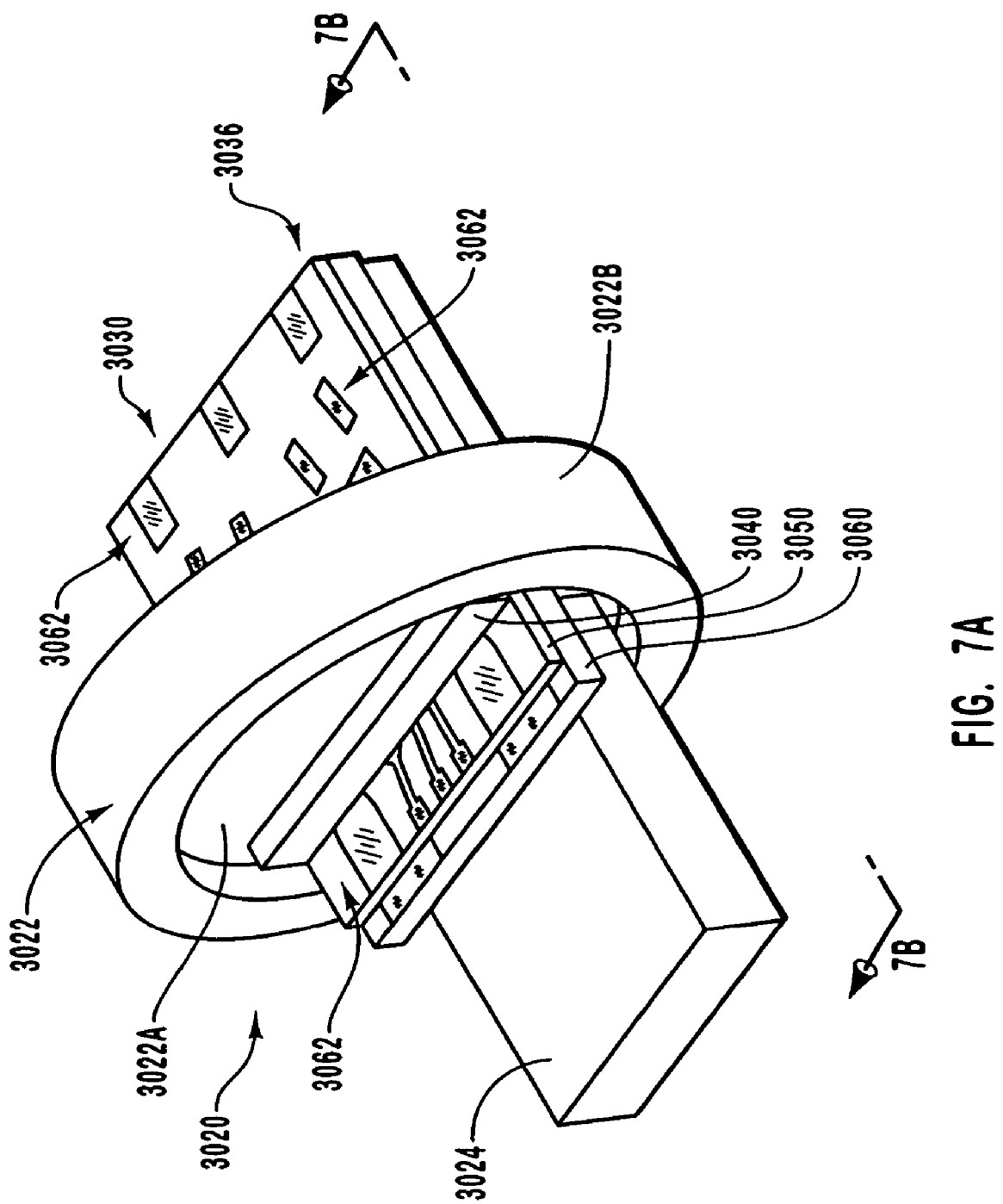
FIG. 7A is a perspective view of the header assembly comprising part of the transmitter optical subassembly shown in FIG. 6.
Figure 7B:
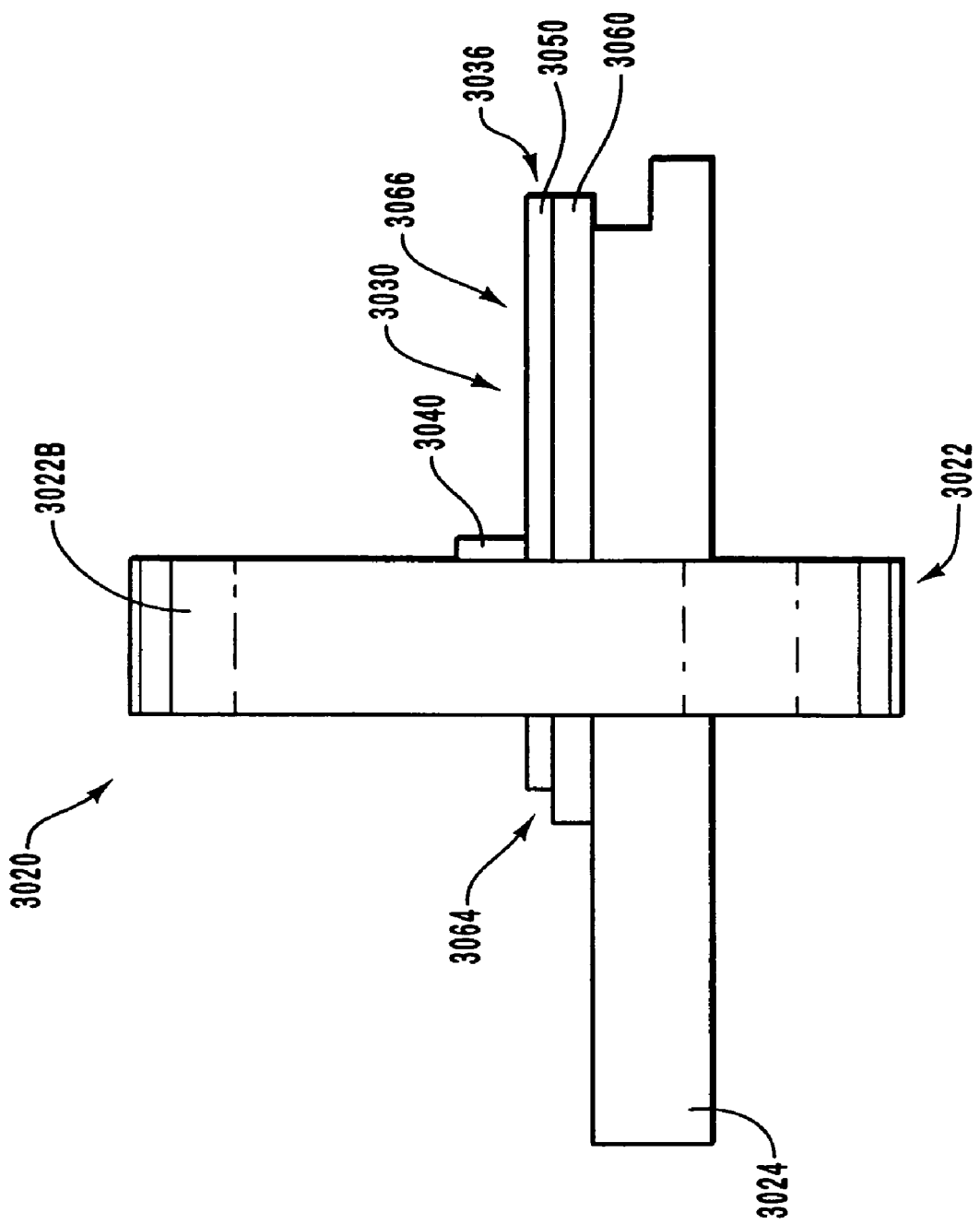
FIG. 7B is a side view of the header assembly of FIG. 7A.

With continuing attention to FIG. 6, reference is now made to FIGS. 7A and 7B, which show perspective and side views, respectively, of the header assembly 3020 according to the present embodiment. As seen in the figures, the header assembly 3020 generally comprises several components including a base 3022, a cap 3023 (FIG. 6), a thermal slug 3024, and a multi-layer platform ("MLP"), designated generally at 3030. Details of each of these components, as well as their interrelationship, are given below.

As shown in FIGS. 6, 7A, and 7B, the base 3022 of the header assembly 3020 comprises a disk portion 3022A and a circumferential flange 3022B. The disk portion 3022A and the flange 3022B can be hermetically joined to one another, or integrally formed as a unitary piece. Together with the cap 3023 that mechanically attaches to the flange 3022B, the base 3022 forms a hermetic enclosure 3032 in which various components of the header assembly 3020, such as a laser 3034, can be positioned. As has been described, these components are typically used either directly or indirectly during the operation of the TOSA 3000 to produce a modulated optical signal that can be emitted from an optical transceiver module (not shown) in which the TOSA is disposed. The disk portion 3022A of the base 3022 is preferably made of Kovar, a metallic material having a desirable coefficient of thermal expansion that facilitates the hermetic attachment of the MLP 3030 to the base, as will be seen. Of course, the particular size, shape, configuration, and composition of the base 3022, the cap 3023, and the hermetic enclosure 3032 formed thereby can vary in accordance with the designated application. For instance, in one embodiment the disk portion 3022A of the base 3022 can be made from a copper-tungsten alloy, if desired. Alternatively, in other embodiments the MLP 3030 need not be hermetically enclosed.

The MLP 3030 is shown extending through an aperture defined in the disk portion 3022A of the base 3022. The thermal slug 3024 is also shown extending through the disk aperture, adjacent the MLP 3030. As best seen in FIG. 7B the MLP 3030, as its name implies, is comprised of multiple stacked platform layers 3036 that are joined to form the MLP. Particularly, in the illustrated embodiment, the MLP 3030 includes three platform layers: an upper insulating layer 3040, an intermediate layer 3050, and a lower layer 3060. These layers 3036 are arranged in the stacked configuration shown in FIGS. 7A and 7B and are hermetically sealed together. The layers 3036 are also located atop and hermetically attached to the thermal slug 3024, though other, non-hermetic configurations are also possible. Each layer further includes a plurality of electrically conductive pathways 3062 defined on the surfaces of the various layers 3036. As will be seen, the arrangement of conductive pathways in this manner enables a relatively greater number of input/output interconnects to connect with the header assembly 3020.

Because of the extension of the MLP 3030 hermetically through the base 3022, it is useful to define the portion of the MLP that extends into the hermetic enclosure 3032 (see FIG. 6) as an interior portion 3064 of the MLP and the MLP portion extending away from the base on the exterior of the hermetic enclosure as an exterior portion 3066 of the MLP. This exterior portion/interior portion convention applies and extends to each layer 3036 of the MLP 3030. In accordance with principles of the present invention, and as will be discussed below, the stacked arrangement of the layers 3036, together with the specified configuration of the conductive pathways 3062 defined thereon, enables a relatively greater number of electrical interconnects to be introduced into hermetic enclosure 3032 of the header assembly 3020. This, in turn, desirably allows for enhanced selection, placement, and operation of optoelectronic components within the hermetic enclosure 3032.

Each of the layers 3036 of the MLP 3030 is formed of an insulative material. In the illustrated embodiment, each of the layers 3036 is composed of a co-fired ceramic material, such as alumina or aluminum nitride. Notwithstanding, other materials, such as aluminum nitrate, beryllium oxide, or other insulative ceramic and non-ceramic materials could also be acceptably employed. Further details concerning the structure and configuration of each of the layers 3036 of the MLP 3030 are given below in connection with FIGS. 9 and 10.

Figure 8A:
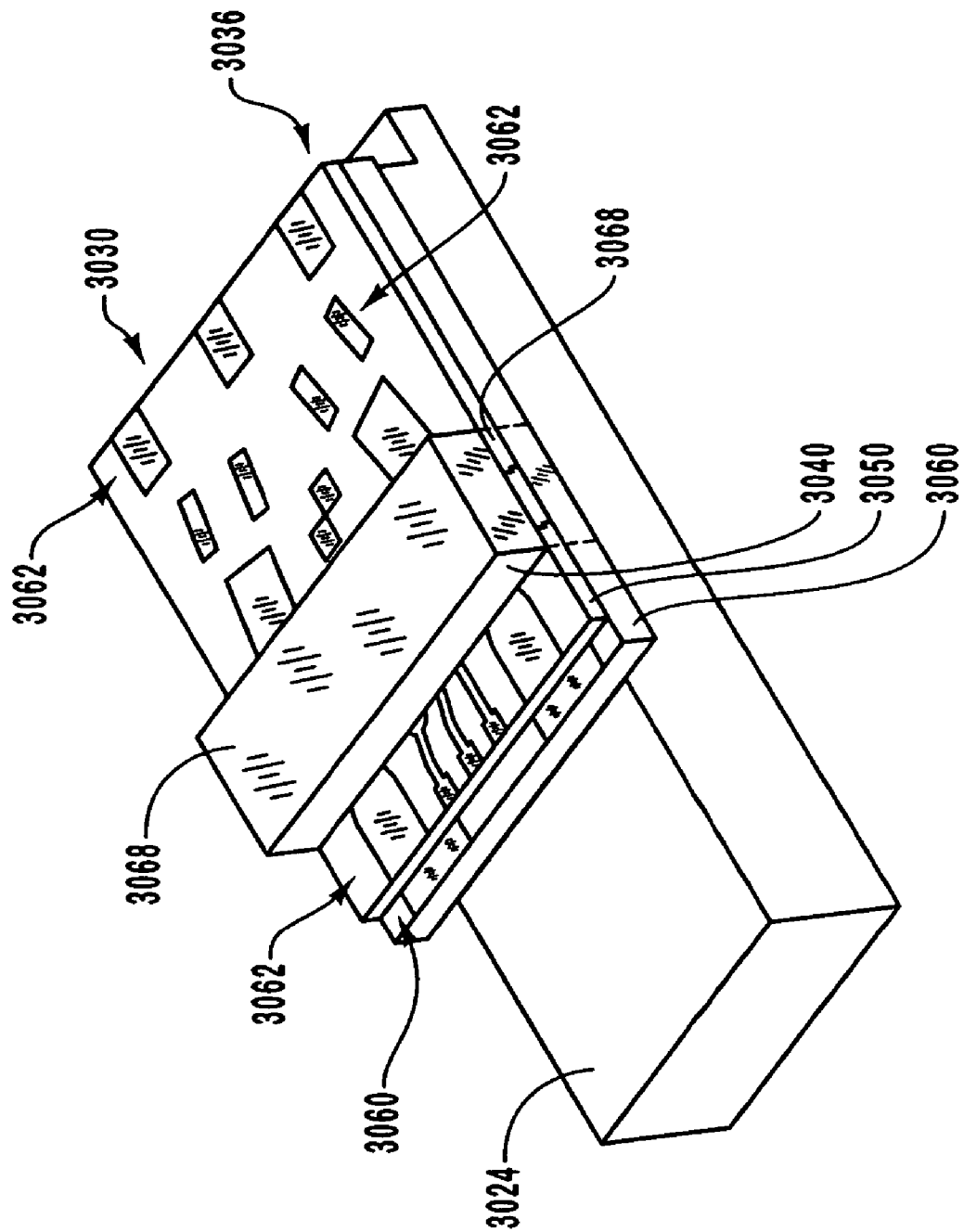
FIG. 8A is a perspective view of the header assembly of FIG. 7A with the circular base removed.
Figure 8B:
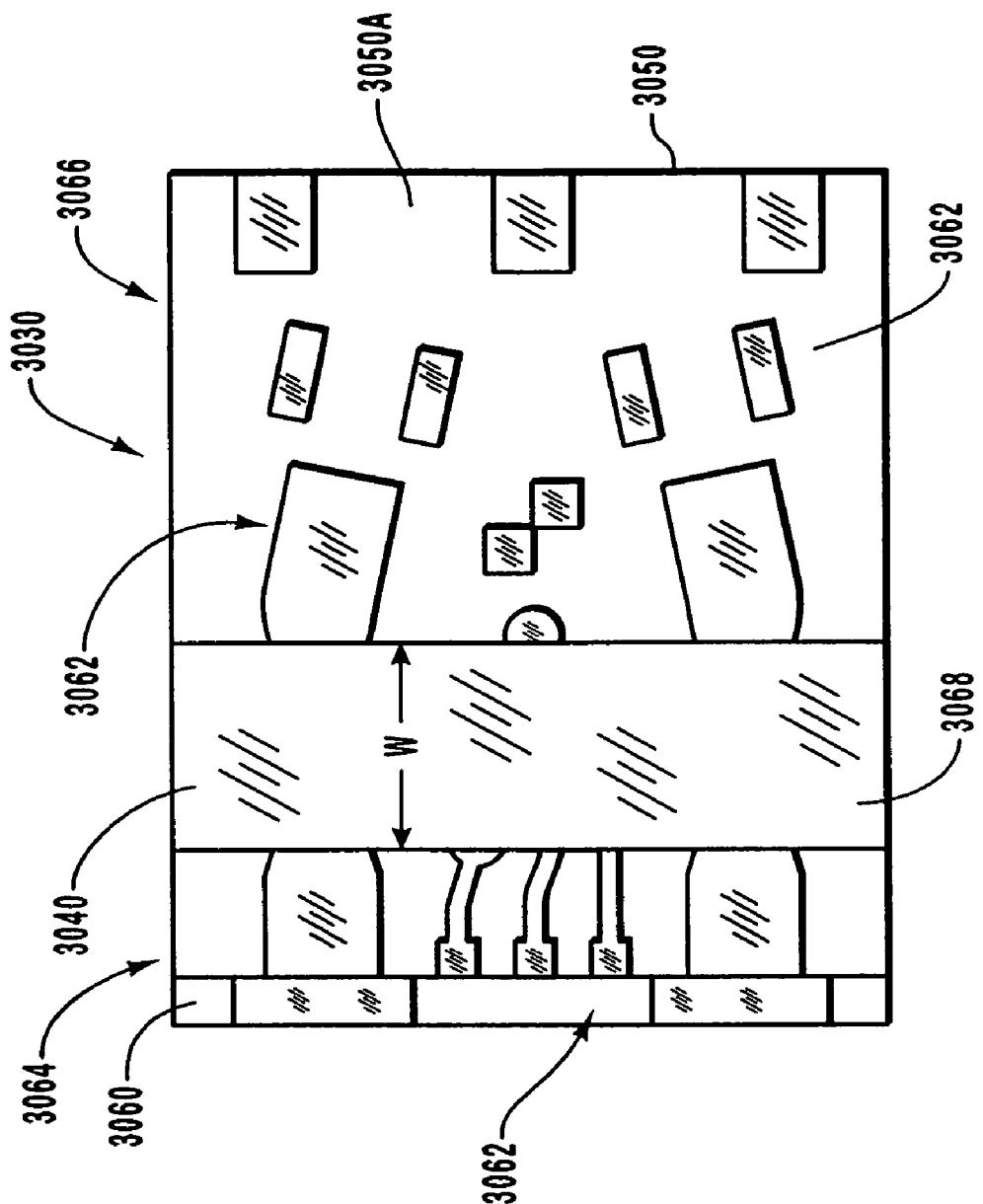
FIG. 8B is a top view of the header assembly of FIG. 8A.

Reference is now made to FIGS. 8A and 8B, which depict various views of the MLP 3030 as separated from the base 3022 of the header assembly 3020. In these views the relative sizes and respective placement of each of the layers 3036 and conductive pathways 3062 of the MLP 3030 is more clearly shown. As illustrated, the upper insulating layer 3040 includes a relatively short slab of ceramic material that spans the overall width of MLP 3030. The upper insulating layer 3040 has a width "w" that is slightly greater than the thickness of the disk portion 3022A of the base 3022. As will be explained in greater detail below, this width is sufficient to allow the upper layer 3040 to electrically isolate the conductive pathways 3062 located on the surface of the intermediate layer 3050 (positioned below the upper layer) from the base 3022, which is preferably formed of an electrically conductive metal. Though shown in the figures as being relatively thick with respect to the layers 3050 and 3060, the upper layer 3040 can have one of a variety of thicknesses according to the need for electrical isolation and the space requirements of the header assembly 3020.

As mentioned above, the base 3022—especially the disk portion 3022A—can be composed of Kovar, copper-tungsten, or another suitable material that possesses a coefficient of thermal expansion that is substantially similar to that of the ceramic from which the layers 3036 are made. The similarity of coefficients of thermal expansion enables a suitable, hermetic seal to be formed between the base 3022 and the MLP 3030, thereby preserving the integrity of the hermetic enclosure 3032. To enable adhesion between the aperture in the disk portion 3022A and the MLP 3030, a metallization layer, preferably of a tungsten alloy, titanium, or a titanium-tungsten alloy with a copper coating, is formed about a portion of the outer periphery of the MLP 3030, as indicated at 3068. The metallization layer 3068 is deposited on these surfaces using standard deposition techniques and is necessary to enable the base material to adhere to the MLP 3030. The joining of the base 3022 to the MLP 3030 can be accomplished by brazing with a copper-silver braze, or by other suitable means to form a hermetic seal therebetween.

As can be seen in FIGS. 8A and 8B, the upper insulating layer 3040 overlays a portion of the intermediate layer 3050 and the conductive pathways 3062 located thereon. As mentioned, this arrangement enables the upper insulating layer 3040 to prevent the metallic disk portion 3022A of the base 3022 from directly contacting the conductive pathways 3062 on the intermediate layer 3050. Thus, this configuration enables the conductive pathways 3062 of the intermediate layer 3050 to pass from the exterior portion 3066 to the interior portion 3064 of the header assembly 3020 without electrical or other interference from the base 3022. The thickness of the upper insulating layer 3040 is great enough as to provide sufficient separation between the conductive pathways 3062 located on the intermediate layer 3050 and the base 3022. This separation is beneficial in preventing electrical shorting of electric fields created by some of the conductive pathways 3062, which electric fields include field components that exist above the surface of the intermediate layer 3050. It is nonetheless appreciated that an upper insulating layer having differing shape, composition, or configuration from that shown in FIG. 8A and 8B can also be utilized while still satisfying the functionality as described herein.

Also evident from FIG. 8B is the fact that the lower layer 3050 is sized as to extend a small distance farther in relation to the edge of the intermediate layer 3050 on the interior portion 3064. This enables conductive pathways located on the lower layer 3060 to readily connect to a component submount platform disposed within the hermetic enclosure 3032, such as one similar to the submount 902 shown in FIGS. 4A and 4B.

Figure 9:
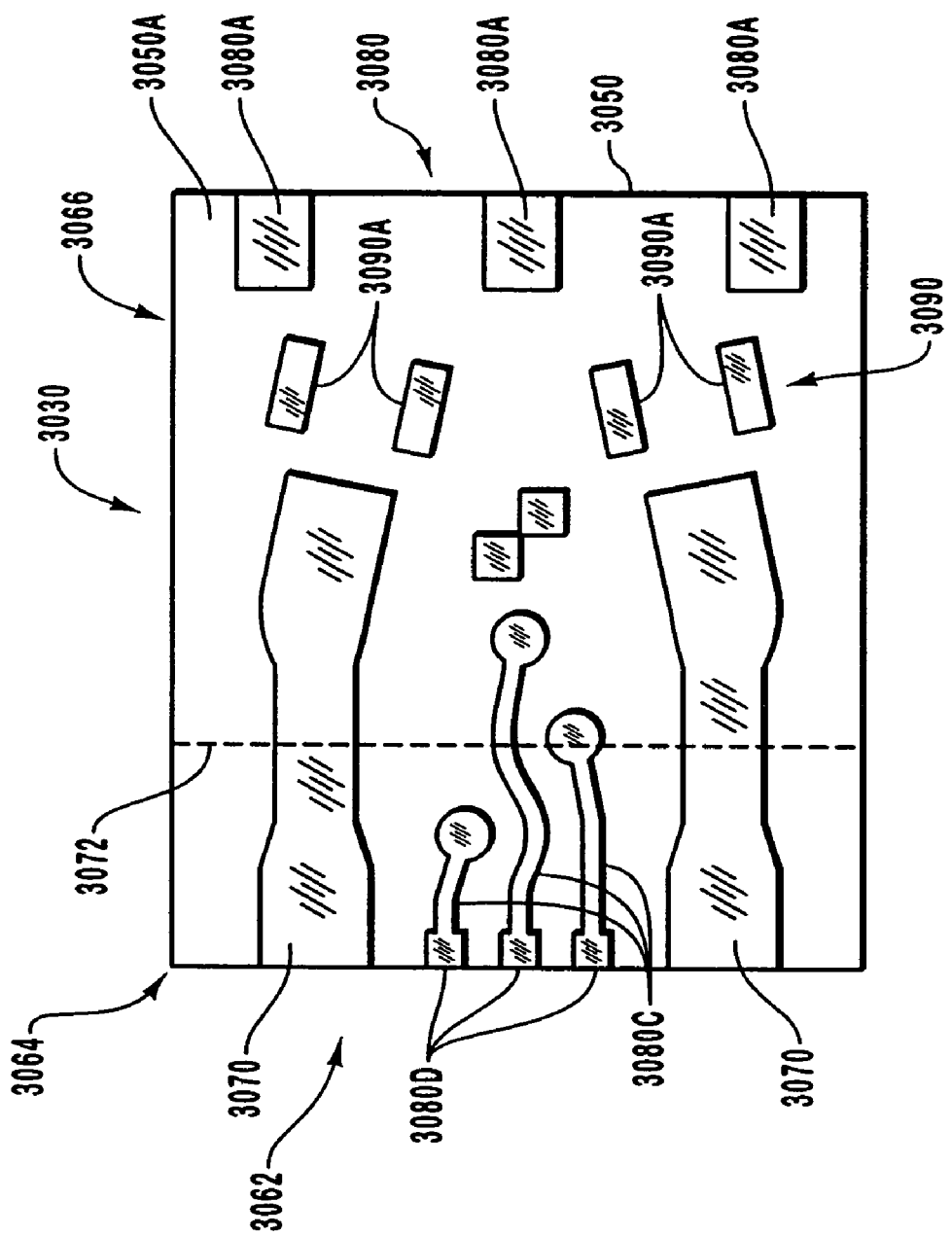
FIG. 9 is a top view of one layer of the multi-layer platform of the header assembly of FIG. 7A.

Attention is now directed to FIG. 9 in describing various details regarding the intermediate layer 3050 of the MLP 3030. As mentioned, the intermediate layer 3050, like the other layers comprising the MLP 3030, is composed of a ceramic material and has located thereon various conductive pathways 3062. The conductive pathways 3062 in the present embodiment are preferably deposited on the various layer surfaces using patterning techniques, though other pathway formation practices, such as thin film deposition, could also be acceptably used. Preferably, each of the conductive pathways 3062 comprises traces made from high temperature conductive metal(s), such as a tungsten alloy, which is then preferably covered with a gold plating. Use of a high temperature metal advantageously enables the ceramic to be produced using co-fired techniques.

Figure 10:
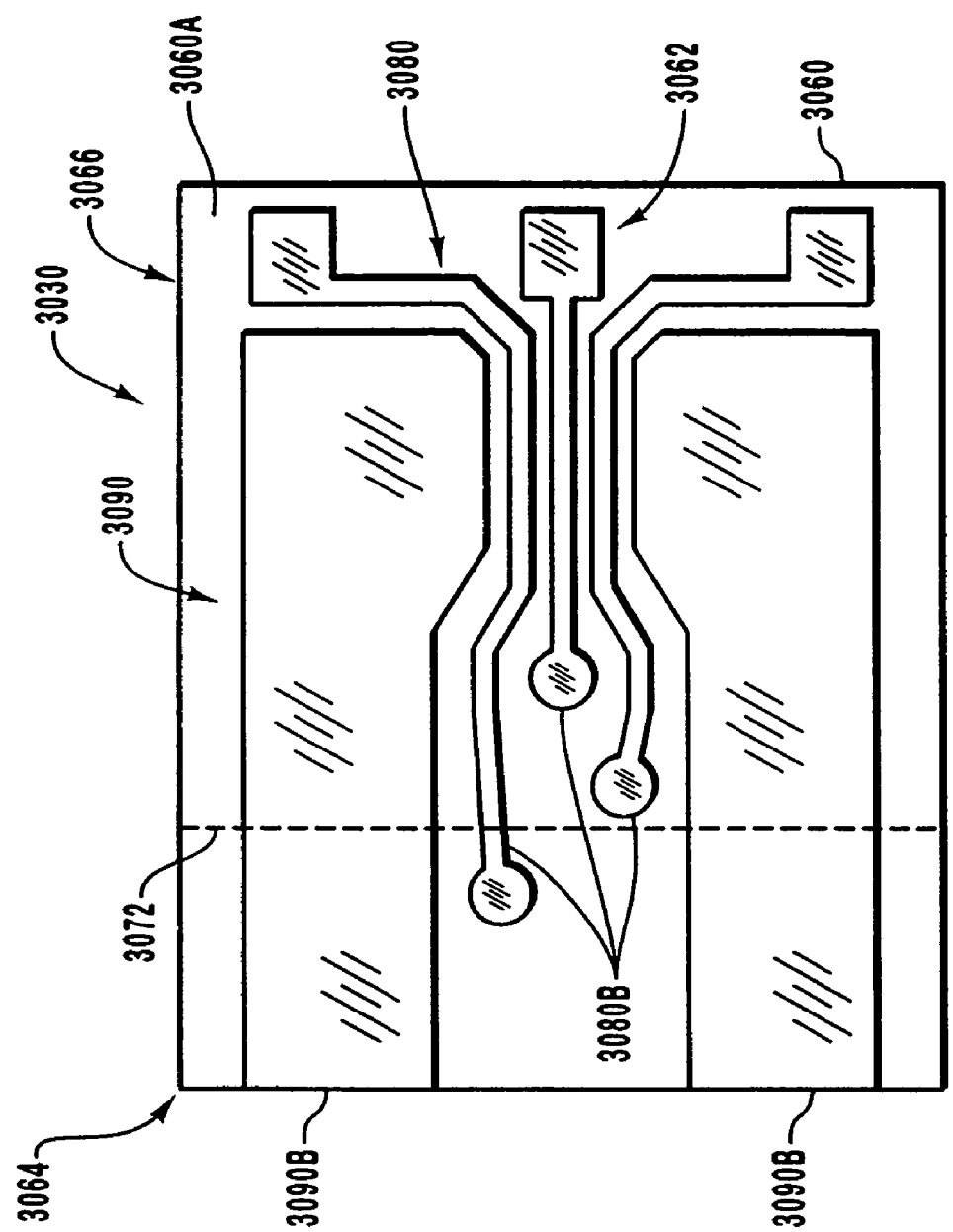
FIG. 10 is a top view of another layer of the multi-layer platform of the header assembly of FIG. 7A.

It is noted here that both the type and positioning of the conductive pathways 3062 on the various layers 3036 of the MLP 3030 is preferably precisely configured such that space on MLP surfaces is optimized and performance of the pathways and optoelectronic components attached thereto is maximized. Further, the conductive pathways shown in the accompanying figures are configured according to a particular header assembly design. Thus, while the conductive pathway design to be described below in connection with FIGS. 9 and 10 illustrates one possible configuration, other configurations are also possible.

FIG. 9 shows a top surface 3050A of intermediate layer 3050 that includes various conductive pathways 3062, or portions thereof. Generally, conductive pathways 3062 (or portions thereof) of three types are shown on the top surface 3050A: high speed, transmission lines, general signal lines, and ground signal lines. Each of these is described in more detail below.

Two high speed transmission lines 3070 are shown on the top surface 3050A. In the present embodiment, these lines are employed in transmitting an electrical signal from a host device (not shown) to an optoelectronic component (such as a modulator or a direct modulated DFB laser) located on a submount (see FIGS. 4A, 4B) within the header assembly 3020. As such, these lines are configured for high speed transmission of such signals. Each transmission line 3070 extends from a terminal end on the exterior portion 3066 of the intermediate layer top surface 3050A to a terminal end on the interior portion 3064 of the intermediate layer top surface. For clarity, the interior and exterior portions 3064 and 3066 of the MLP 3030 are designated in FIG. 9, separated by a superimposed dashed line 3072, which approximately corresponds to the central area of passage of the MLP 3030 through the base 3022. (Line 3072 also approximately delineates the exterior portion 3066 of the MLP 3030 from the interior portion 3064.)

The transmission lines 3070 on the intermediate layer top surface 3050A are configured for optimum transmission of electrical signals, in this case, electrical data signals for use by a laser, such as the laser 3034 in FIG. 6. In accordance with principles taught in connection with previous embodiments of the invention, the transmission lines 3070 are geometrically shaped so as to optimize their transmission properties and to improve the impedance matching between the lines themselves and the components to which they are connected, such as the laser 3034, which operates at 25 ohms impedance in this case. The shaping of each transmission line 3070 for impedance matching purposes can be seen in FIG. 9, where the width of each transmission line 3070 is narrowed near the point where it passes through the area of passage of the MLP 3030 through the base 3022, which area is again approximately indicated by the phantom line 3072.

Depending on the intended application, the high speed transmission lines 3070 can comprise one of several types of conductive traces. In the illustrated embodiment, the transmission lines 3070 are configured as microstrip traces on the intermediate layer top surface 3050A. As such, an adequate ground plane, discussed below in connection with FIG. 10, is positioned directly below each transmission line 3070, as will be discussed. In another embodiment, the high speed transmission lines 3070 can be co-planar traces, having ground planes that are laterally adjacent the traces on the same layer surface. These co-planar transmission lines are treated further below in connection with FIG. 13. In addition to these embodiments, high speed traces of other types, including slotline and general waveguide structures, could also be acceptably used.

In addition to the high speed transmission lines 3070, FIG. 9 shows the second type of conductive pathway utilized in the MLP 3030 of the present embodiment. Specifically, portions of general signal lines 3080 are shown on the intermediate layer top surface 3050A of FIG. 9. The general signal lines 3080 are used to provide interactive control between control circuitry located outside of the header assembly 3020 (such as on a printed circuit board located within the optical transceiver in which the TOSA 3000 is disposed) and one or more components located within the header assembly 3020. Components within the header assembly 3020 that can be interconnected using the general signal lines, 3080 include, but are not limited to, thermistors, some lasers (such as EML lasers that are discussed in previous sections of the application), monitor photodiodes, and wavelength lockers.

In particular, three general signal lines 3080 are shown in the present embodiment of the MLP 3030, each having a terminal end in the form of a contact pad 3080A positioned at an edge of the exterior portion 3066 of the intermediate layer top surface 3050A. These contact pads 3080A are configured to electrically interconnect with an appropriately configured interface, such as the flex circuit 820 shown in FIG. 4E, for example, for electrical communication with components disposed outside of the header assembly 3020, such as components disposed on a transceiver printed circuit board.

Each contact pad 3080A interconnects with a second portion 3080B of each general signal line 3080 that is located on the lower layer 3060 of the MLP 3030 by way of conductive vias (not shown) defined through the intermediate layer 3050. As used herein, conductive vias such as those just mentioned can comprise, for example, conductively plated through holes defined through one or more layers of the MLP 3030, or other similar structures having the same functionality. Details concerning this second general signal line portion 3080B, shown in FIG. 10, are given further below.

Also shown on the intermediate layer top surface 3050A are portions 3080C of each general signal line 3080. Each of the three general signal line portions 3080C is formed as a conductive trace upon the intermediate layer top surface 3050A, and is interconnected with the respective general signal line portions 3080B located on the lower layer 3060 by way of conductive vias (not shown) defined through the intermediate layer 3050. Each general signal line portion 3080C terminates at a contact pad 3080D located on an edge of the intermediate layer top surface 3050A on the interior portion 3064 of the MLP 3030. Each contact pad 3080D can then be electrically connected to a component within the header assembly 3020, as will be explained.

A portion of the third type of conductive pathway 3062 is also shown in FIG. 9. Specifically, portions of four ground signal lines 3090 are shown on the intermediate layer top surface 3050A in FIG. 9. In general, the ground signal lines 3090 are responsible for providing the necessary ground planes for conductive pathways defined on the various MLP layers, and specifically, for providing a ground plane for proper operation of the high speed transmission lines 3070 described above. As shown in FIG. 9, four ground signal line contact pads 3090A are shown on the exterior portion 3066 of the intermediate layer top surface 3050A in a specified configuration. So positioned, the contact pads 3090A can electrically interface with an appropriate ground signal source provided, for instance, via a flex circuit (see 820 in FIG. 4E) to provide the ground signal to the MLP 3030 as required. Each ground signal line pad 3090A electrically connects with one of two ground signal line portions located on the lower layer 3060 of the MLP 3030 in a manner to be described below.

Reference is now made to FIG. 10 in describing various details concerning the lower layer 3060 of the MLP 3030, which in the present embodiment is positioned directly below the intermediate layer 3050. As shown, the lower layer 3060 includes, like the intermediate layer, several portions of conductive pathways 3062. Particularly, the lower layer 3060 features a top surface 3060A whereon the conductive pathway portions are defined. Three general signal line portions 3080B are shown defined on the lower layer top surface 3060A, beginning at the exterior portion 3066 of the MLP 3030 and extending toward the interior portion 3064 thereof. (Again, for clarity, the approximate division of interior portion 3064 of the MLP 3030 from the exterior portion 3066 is denoted by the phantom line 3072.) The terminal end of each general signal line portion 3080B that is located on the exterior portion 3066 is vertically aligned with and electrically connected to the respective contact pad 3080A located on the intermediate layer top surface 3050A by a conductive via (not shown) defined through the intermediate layer. Likewise, the other terminal end of each general signal line portion 3080B that is located toward the interior portion 3064 is vertically aligned with and electrically connected to the respective inward terminal ends of the general signal line portions 3080C located near the line 3072 on the intermediate layer top surface 3050A. This electrical connection is also made by way of conductive vias (not shown) defined through the intermediate layer.

In view of the above, then, a plurality of complete general signal line conductive pathways are defined by the general signal line portions 3080A–3080D. Indeed, FIGS. 9 and 10 depict three complete general signal lines 3080 defined in the MLP 3030 that extend from the exterior portion 3066 of the MLP to the interior portion 3064 thereof. The conductive signal pathway defined by each of these general signal lines 3080 extends first from the contact pads 3080A through conductive vias defined through the intermediate layer 3050 to the exterior portion terminal end of the signal line portions 3080B. The conductive pathway continues along each signal line portion 3080B to the other terminal end, where it extends back through the intermediate layer 3050 to the top surface 3050A thereof through conductive vias to interconnect with the terminal end nearest the line 3072 of each respective signal line portion 3080C. The conductive signal pathway then terminates at the contact pads 3080D positioned at the adjacent terminal end of each signal line portion 3080C on the edge of the interior portion 3064 of the intermediate layer top surface 3050A.

The multi-layer configuration of the general signal lines 3080 in the MLP 3030 maximizes use of the intermediate layer top surface 3050A by freeing up space (that would otherwise be occupied by a greater portion of the general signal line portions) thereon for additional interconnections to be located. This results in an increase in the number of conductive pathways that can be placed on the MLP 3030 (i.e., an increased interconnect density), which in turn increases the number or type of electronic and optoelectronic components to be utilized within the header assembly 3020.

The conductive signal pathway defined by each general signal line 3080 enables electrical communication for specified electronic and/or optoelectronic components as described here. (Similar processes are followed for the transmission lines 3070 and the ground signal lines 3090, to be explained further below.) When an electrical signal is provided to one of the contact pads 3080A on the exterior portion 3066 of the intermediate layer 3050 (using a flex circuit such as that shown at 820 in FIG. 4E, for instance), it can travel unrestricted through the MLP 3030 to the interior portion 3064 within the hermetic enclosure 3032 of the header assembly 3020 (FIG. 6) using the conductive pathway of the general signal line as just described. From there, the electrical signal can proceed to any one of a variety of specified electronic or optoelectronic components disposed within the hermetic enclosure 3032. In one embodiment, the electronic and/or optoelectronic component(s) that receives the electrical signal via one of the general signal lines 3080 is mounted on a submount (such as submount 902 in FIGS. 4A–4C) that is positioned at least indirectly on the thermal slug 3024 to be adjacent the interior portion 3064 of the MLP 3030 within the hermetic enclosure 3032. Wire bonds, wedge-wedge bonds, ribbon bonds, submount traces and/or other appropriate interconnects can be used to electrically connect the electronic and/or optoelectronic component on the submount with one or more of the general signal line contact pads 3080D on the intermediate layer top surface 3050A. In this way, electrical communication between components located within the hermetic enclosure 3032 of the header assembly 3020 and devices external to the header assembly 3020 can be accomplished by way of the general signal lines 3080.

It is noted here that the submount used in the above example can be integrally formed with the MLP 3030, or can comprise a separate component. If the submount is configured as a separate component, replacement of one submount within the header assembly 3020 with another submount is possible, adding modularity to the TOSA package.

FIG. 10 also shows various details concerning portions of the ground signal line 3090. Particularly, two ground signal line portions 3090B are located on the lower layer top surface 3060A and are electrically interconnected with the ground signal contact pads 3090A located on the intermediate layer top surface 3050A by conductive vias (not shown) or other appropriate interconnects. The ground signal line portions 3090B occupy a substantial portion of the lower layer top surface 3060A and are aligned in the illustrated embodiment to be positioned directly below the high speed transmission lines 3070. So arranged, the ground signal line portions 3090B, when supplied with an appropriate ground signal from the ground signal line contact pads 3090A (again, such as via the flex circuit 820 in FIG. 4E), serve as truncated ground planes for the high speed transmission lines 3070, thereby enabling their proper operation. Again, it is seen how the multi-layer configuration of the MLP 3030 enhances operation of the header assembly by enabling distribution of a ground signal in an efficient manner while still preserving space in the MLP 3030 for other types of conductive pathways.

As has already been described above in connection with the general signal lines 3080, each of the conductive pathways 3062 discussed herein, i.e., the high speed transmission lines 3070, the general signal lines, and the ground signal lines 3090, enable electrical signals to be provided to specified electronic and/or optoelectronic components located on a surface—such as the submount 902 shown in FIGS. 4A–4C—within the hermetic enclosure 3032 of the header assembly 3020 (FIG. 6). The conductive pathways 3062 can electrically connect to a corresponding component on the submount via one or more interconnects. In one embodiment, for example, the terminal end of each high speed transmission line 3070 located on the interior portion of the MLP 3030 can electrically connect with a laser (see laser 3034 in FIG. 6) positioned on a submount via wire bonds extending between the submount and the transmission line terminal end. Also, the general signal lines 3080 connect to designated components in the manner already described further above. Finally, the ground signal lines 3090 can interconnect with submount components as needed, in addition to providing ground planes for the transmission lines 3070.

Electrical signals to be delivered to the MLP 3030 from outside the header assembly 3020 are provided via a suitable interface, such as the flex circuit 820 shown in FIG. 4E. The flex circuit is patterned with electrical interconnects that are configured to complementarily engage with each of the contact points of the various conductive pathways 3062 located on the exterior portion 3066 of the intermediate layer top surface 3050A. The flex circuit, in turn, is electrically connected with corresponding components located on, for instance, a printed circuit board forming, along with the header assembly 3020, part of an optical transceiver module. In this way then, electrical interconnection between internal header assembly components and external components is achieved in a manner that enables both the number and type of interconnects through the hermetic enclosure of the header assembly to be increased in a substantially efficient manner, thereby adding to header assembly performance. Further details concerning exemplary flex circuits that can be employed with embodiments of the multi-layer platform of the present invention can be found in U.S. application Ser. No. 10/409,837, entitled "Flexible Circuit for Establishing Electrical Connectivity with Optical Subassembly," filed on Apr. 9, 2003, which is incorporated herein by reference in its entirety.

It should be noted that both the number and specific configuration of conductive pathways that are defined in the MLP 3030 can be altered in a variety of ways to suit other applications. One example of this is given in the following embodiment, but this should not be considered limiting of the present invention in any way. Rather, the embodiments described herein are merely exemplary of the principles of the present invention.

Finally, it is appreciated that in one embodiment conductive traces can be configured such that they themselves form one or more components, such as integrated resistors or capacitors, for instance.

Figure 11A:
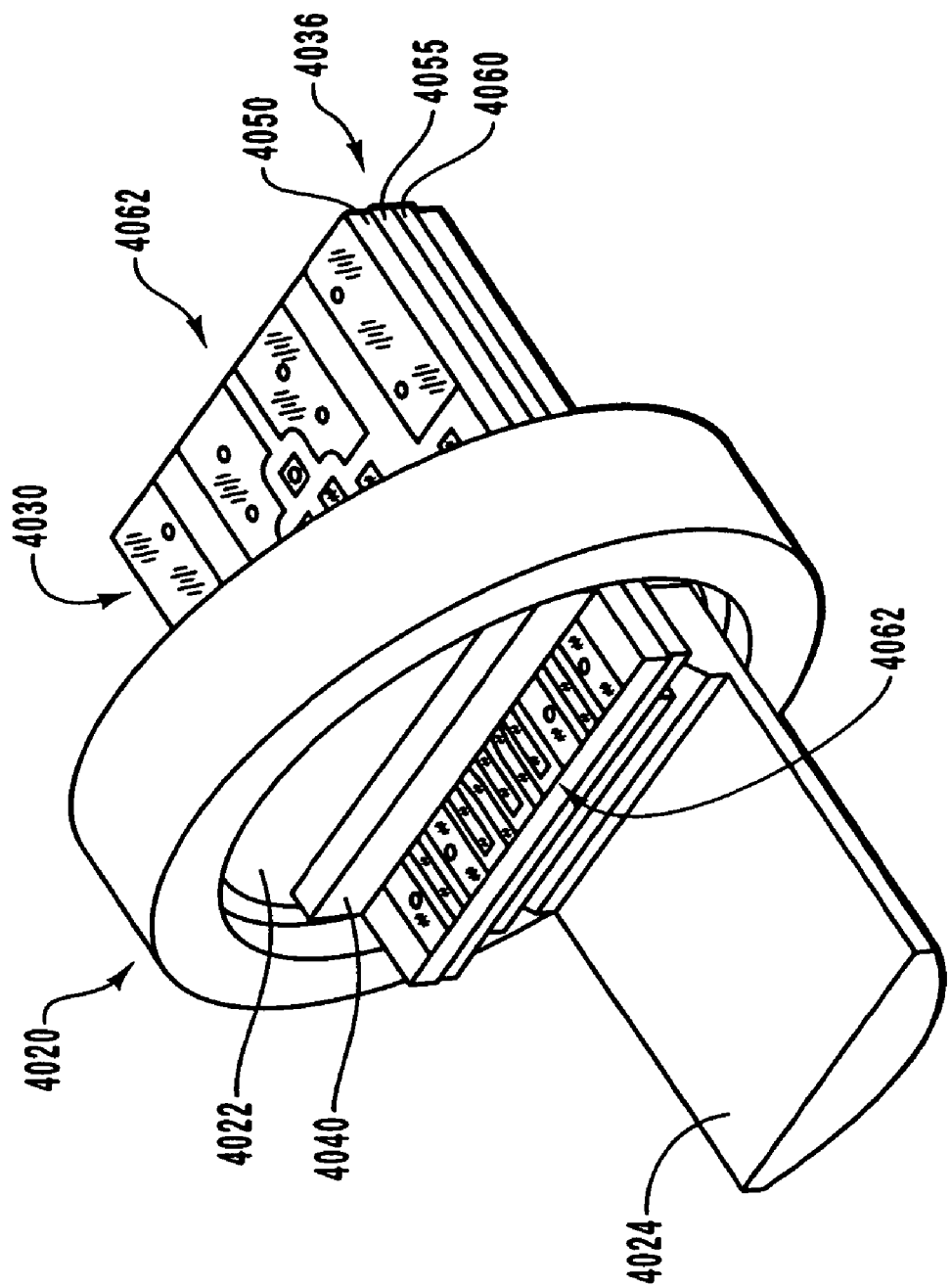
FIG. 11A is a perspective view of a header assembly configured in accordance with another embodiment of the present invention.

Reference is now generally made to FIGS. 11A–16 in describing various details regarding a header assembly, generally designated at 4020, made in accordance with yet another embodiment of the present invention. The header assembly 4020 generally includes, as best seen in FIG. 11A, a base 4022, a thermal slug 4024, and a multi-layer platform ("MLP") 4030. As the header assembly 4020 shares several common features with embodiments of the present invention previously described herein, especially with regard to the header assembly 3020 depicted in FIGS. 7A–10, only selected features of the header assembly 4020 will be discussed below.

With reference first to FIGS. 11A and 11B, the base 4022 of the header assembly 4020 is hermetically bisected by both the thermal slug 4024 and the MLP 4030 so that a portion of each is located within a hermetic enclosure, similar to previous embodiments. In accordance with the present embodiment, the MLP 4030 features a plurality of stacked layers 4036, preferably comprising ceramic, that are hermetically joined to one another. Specifically, the stacked layers 4036 include an upper insulating layer 4040, an upper intermediate layer 4050, a lower intermediate layer 4055, and a lower layer 4060. The stacked layers 4036 of the MLP 4030 are hermetically joined to the thermal slug 4024.

In the configuration shown in FIGS. 11A and 11B, an interior portion 4064 and an exterior portion 4066 of the MLP 4030 are defined with respect to the base 4022 through which the MLP passes. The interior portion 4064 of the MLP 4030 is configured for disposal within a hermetic enclosure formed by the base 4022 and a cap (not shown) affixed to the base. The exterior portion 4066 of the MLP 4030, which extends relatively farther from the base 4022 than does the interior portion 4064, is positioned outside of the hermetic enclosure to enable electrical interconnection of various components located outside of the hermetic enclosure with components positioned therein.

Figure 12:
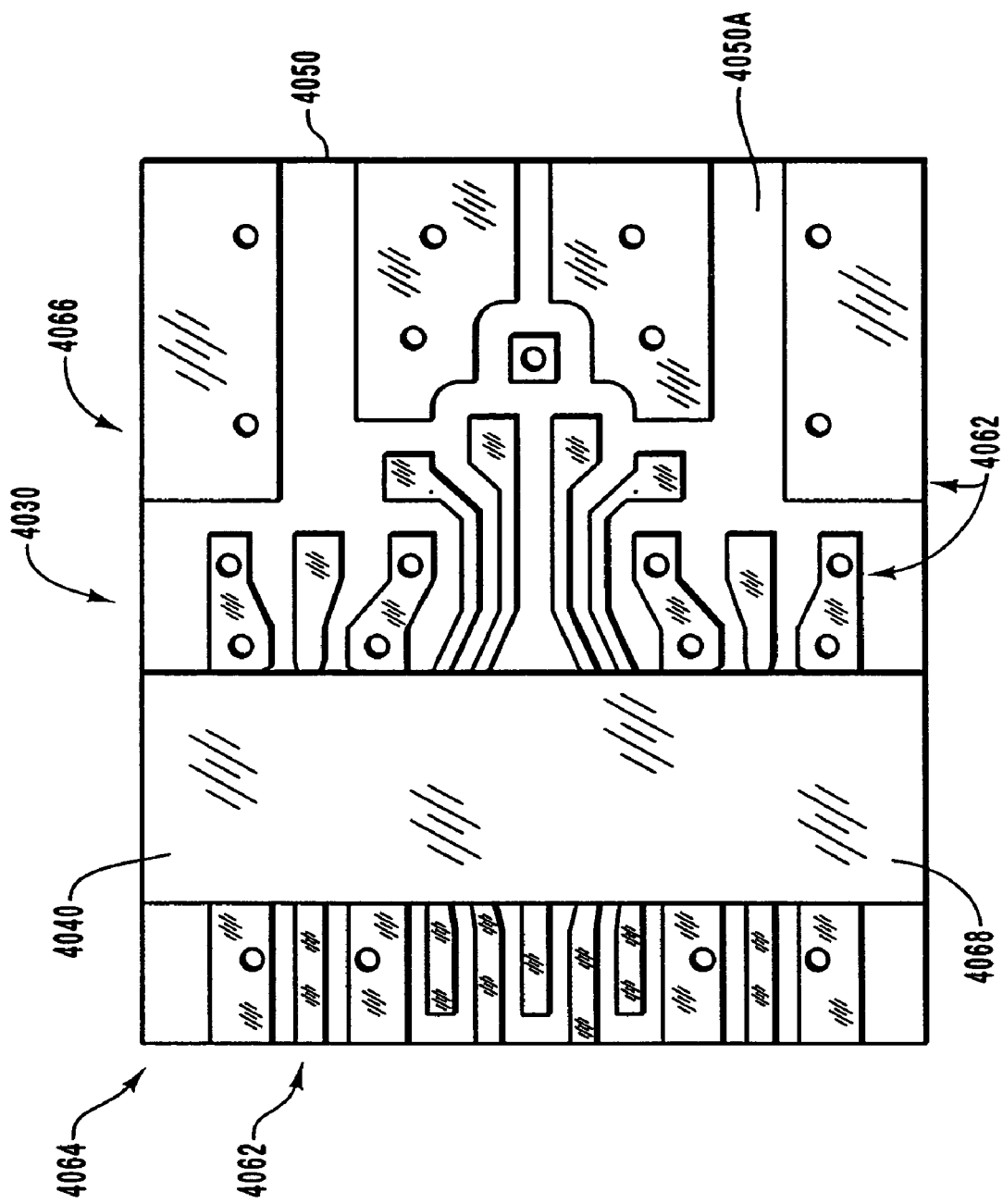
FIG. 12 is a top view of the header assembly of FIG. 11A with the circular base removed.

Reference is now made to FIG. 12, which depicts a top view of the MLP 4030 being separated from the base 4022. As shown, the upper insulating layer 4040 is positioned atop a portion of various traces, or conductive pathways 4062, that are located on a top surface 4050A of the upper intermediate layer 4050. The upper insulating layer 4040 provides an insulative barrier between the base 4022 of the header assembly 4020 and the conductive pathways 4062, thereby enabling the conductive pathways to extend between the exterior and interior MLP portions 3066 and 3064. As before, a metallization layer 4068 is deposited on the outer surface of the upper insulating layer 4040, as well as around corresponding portions of the periphery of the MLP 4030 to enable the ceramic MLP 4030 to hermetically seal with the base 4022.

Figure 13:
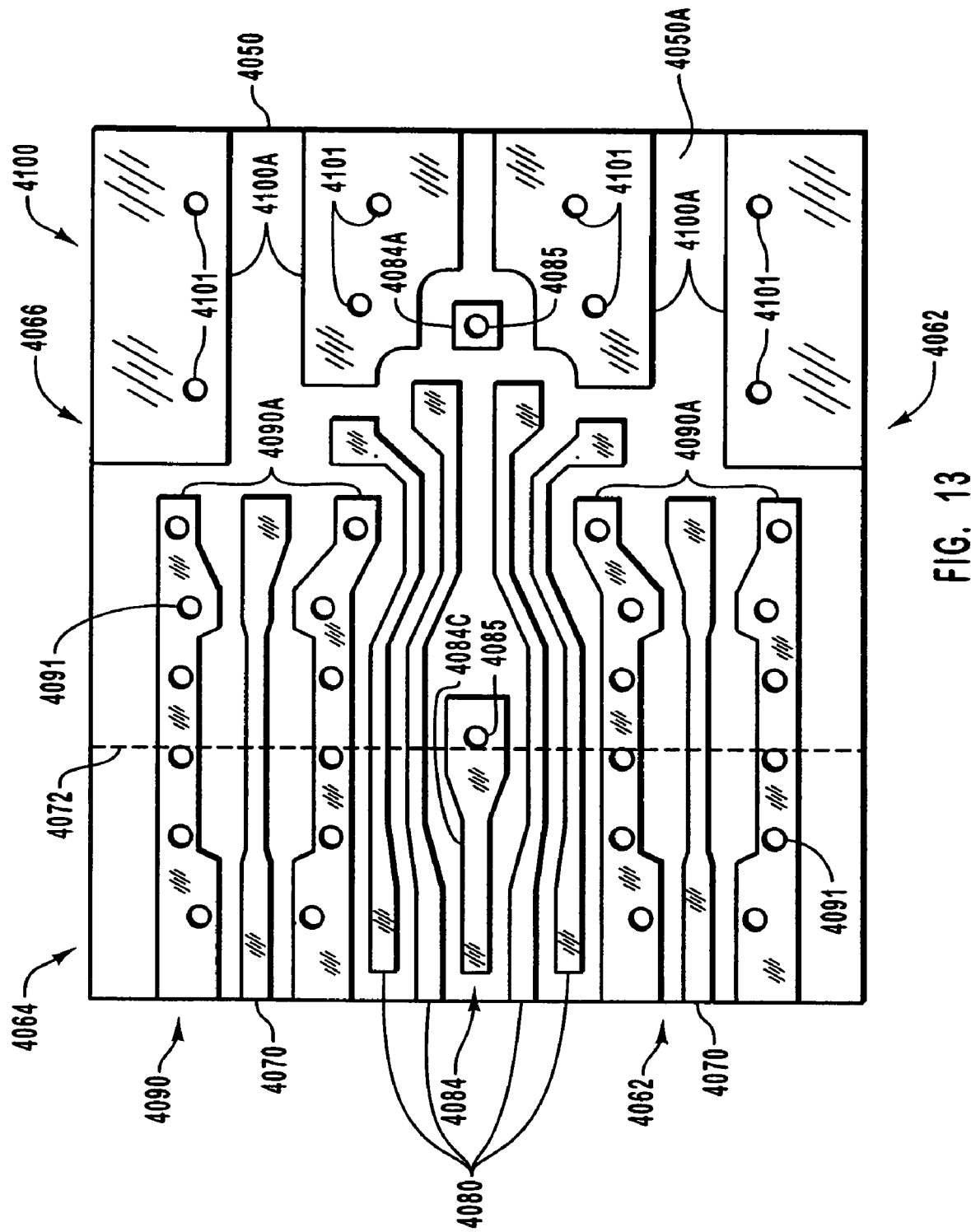
FIG. 13 is a top view of one layer of the multi-layer platform of the header assembly of FIG. 11A.

Reference is now made to FIG. 13, showing the various conductive pathways 4062 located on the upper intermediate layer top surface 4050A. Each conductive pathway 4062 preferably comprises a tungsten alloy having a gold top plating and is deposited on the surface of one or more of the stacked layers 4036 using one or more of a variety of techniques. Again, the specific configuration and shape of the various conductive pathways shown in these figures is exemplary; other pathway configurations could be utilized depending on the desired application.

Specifically, FIG. 13 first shows two high speed transmission lines 4070, each bounded by portions of two ground signal lines 4090. The high speed transmission lines 4070 each extend from the exterior portion 4066 of the MLP 4030 to the interior portion thereof, and comprise a hybrid microstrip/co-planar structure. As such, each transmission line 4070 uses both co-planar ground signal line portions, shown at 4090A, and a ground signal plane (to be discussed below) for proper operation. Of course, the high speed transmission lines 4070 can comprise a co-planar trace only, a microstrip trace only, or one of each, if desired. Thus, the illustrated configuration should not be construed as limiting the present invention.

Two sets of two ground signal line portions 4090A are located on the upper intermediate layer top surface 4050A to be co-planar with, and laterally adjacent to, one of the two high speed transmission lines 4070, as shown in FIG. 13. In this configuration, each set of ground signal line portions enables proper operation of a respective one of the hybrid high speed transmission lines 4070. Like the transmission lines 4070, each ground signal line portion 4090A extends between the exterior portion 4066 and the interior portion 4064 of the MLP 4030, the division between interior and exterior portions being approximately delineated by phantom line 4072. Each ground signal line portion 4090A is electrically connected to a plurality of conductive vias 4091 defined through the upper intermediate layer 4050 to electrically connect the ground signal line portions 4090A with ground signal planes formed on the lower intermediate layer 4055 (see FIG. 14), as will be discussed.

It is noted that each of the high speed transmission lines 4070 and co-planar ground signal lines 4090 has a specified shaping designed to optimize each trace's operation. Indeed, each of these traces is narrowed slightly in the region corresponding to the area of connection between the upper insulating layer 4040 and the upper intermediate layer 4050, which area is approximately located about the line 4072. This narrowing assists in ensuring adequate impedance matching is achieved with each high speed transmission line 4070 despite each line's passage through the upper insulating layer/upper intermediate layer interface. In the embodiment shown in FIG. 13, for example, each high speed transmission line 4070 is configured for an impedance of about 50 ohms. Other impedance configurations are, of course, possible.

FIG. 13 also shows a plurality of general signal lines 4080 extending between the exterior and interior portion 4064 and 4066 of the MLP 4030. In particular, each general signal line 4080 has one terminal end located on the exterior portion 4066 of the upper intermediate layer top surface 4050A and one terminal end on the interior portion 4064 thereof. Each general signal line 4080 is used to provide electrical signals to or receive electrical signals from components located within the header assembly. Such components include, for example, wavelength lockers, monitor photodiodes, thermistors, etc. The entirety of each general signal line 4080 is located on the upper intermediate layer top surface 4050A.

The MLP 4030 further includes at least one embedded general signal line 4084. As partially shown in FIG. 13, the embedded signal line 4084 includes a terminal contact pad 4084A located on the exterior portion 4066 of the upper intermediate layer top surface 4050A, and another portion 4084C extending toward and terminating on the interior portion 4064 of the upper intermediate layer top surface. The embedded signal line contact pad 4084A and portion 4084C are electrically interconnected to one another by way of a signal line portion located on the lower intermediate layer 4055 (see FIG. 14). This electrical interconnection is achieved using conductive vias 4085 defined through the upper intermediate layer 4050.

Like the general signal lines 4080, the embedded signal line 4084 is used to provide electrical signals to or receive electrical signals from components located within the header assembly, such as, for example, wavelength lockers, monitor photodiodes, thermistors, etc. A portion of the embedded signal line 4084 is located below the top surface 4050A of the upper intermediate layer 4050 so that more space on the top surface is provided for the placement of additional conductive pathways, thereby maximizing the efficient use of the surface area of the multi-layer platform and enabling a relatively greater number of electrical interconnects for components located within the header assembly 4020 to be made.

It is appreciated that the number of embedded signal lines utilized in the MLP 4030 can be increased, if space on the surfaces of the stacked layers 4036 permits. Further, while the illustrated header assembly 4020 features a MLP 4030 having multiple general signal lines 4080 and a single embedded signal line 4084, various numerical and positional configurations of both general and embedded signal lines can be used in the MLP, along with conductive pathways of other types (such as the ground signal lines 4090 and the high speed transmission lines 4070) as discussed herein.

FIG. 13 shows yet another type of conductive pathway 4062 located on the upper intermediate layer top surface 4050A. In particular, portions of four cooling device signal lines 4100 are shown, including four cooling device contact pads 4100A on the exterior portion 4066 of the upper intermediate layer top surface 4050A. Each contact pad 4100A is used to provide an electrical signal to a cooling device, such as a thermoelectric cooler ("TEC") similar to that shown at 900 in FIGS. 4B and 4C that is located within the header assembly 4020. The structure used to interconnect the TEC with the cooling device signal lines 4100 is described further below. Each contact pad 4100A covers a relatively large portion of the upper intermediate layer top surface 4050A. This enables an adequate electrical connection to be made between each cooling device contact pad 4100A and the corresponding contact pad located on the flex circuit (FIG. 4E) or other suitable interface.

The electrical connection between each cooling device contact pad 4100A and the corresponding flex circuit contact pad in one embodiment is attained using a Z-axis conductive epoxy that electrically and adhesively connects the pads to one another. The effectiveness of such a conductive epoxy is maximized when relatively large areas of the contact pads are mated, in order to ensure sufficient current density to meet the power requirements of the TEC. It is noted that each cooling device contact pad 4100A works in concert with the other cooling device contact pads to provide the necessary TEC electrical requirements. In another embodiment, electrical communication between each cooling device contact pad 4100A and the corresponding contact pad of a flex circuit (or other suitable interface) is achieved via conductive solders or other suitable connection schemes. In this case, the size of each cooling device contact pad 4100A can be reduced, owing to the relatively greater efficiency with which currents can be transferred using such connection schemes.

Alternatively, components other than a TEC can be connected to the cooling device signal lines 4100, if needed for a particular application. In such a case, both the number of contact pads, as well as the surface area size of each contact pad, can be modified according to the power requirements of the particular component. Each cooling device contact pad 4100A is electrically connected to other portions of the cooling device signal line 4100 on other MLP layers by way of one or more conductive vias 4101, or other appropriate interconnects.

As seen above, because of the efficient utilization of surface area on the exterior portion 4066 of the upper intermediate layer top surface 4050A, both the number and size of the cooling device signal line contact pads 4100A can be accommodated thereon to provide a sufficient electrical supply for a TEC, for example. Such connectivity would not be possible in prior header assembly configurations.

Portions of the various conductive pathways located on the exterior portion 4066 of the upper intermediate layer top surface 4050A are arranged to electrically connect with a correspondingly configured interface, such as a flex circuit, an example of which is shown at 820 in FIG. 4E. The flex circuit so configured is able to both provide electrical signals to and receive electrical signals from the various electrical and optical components located within the header assembly 4020 via the MLP 4030.

Figure 14:
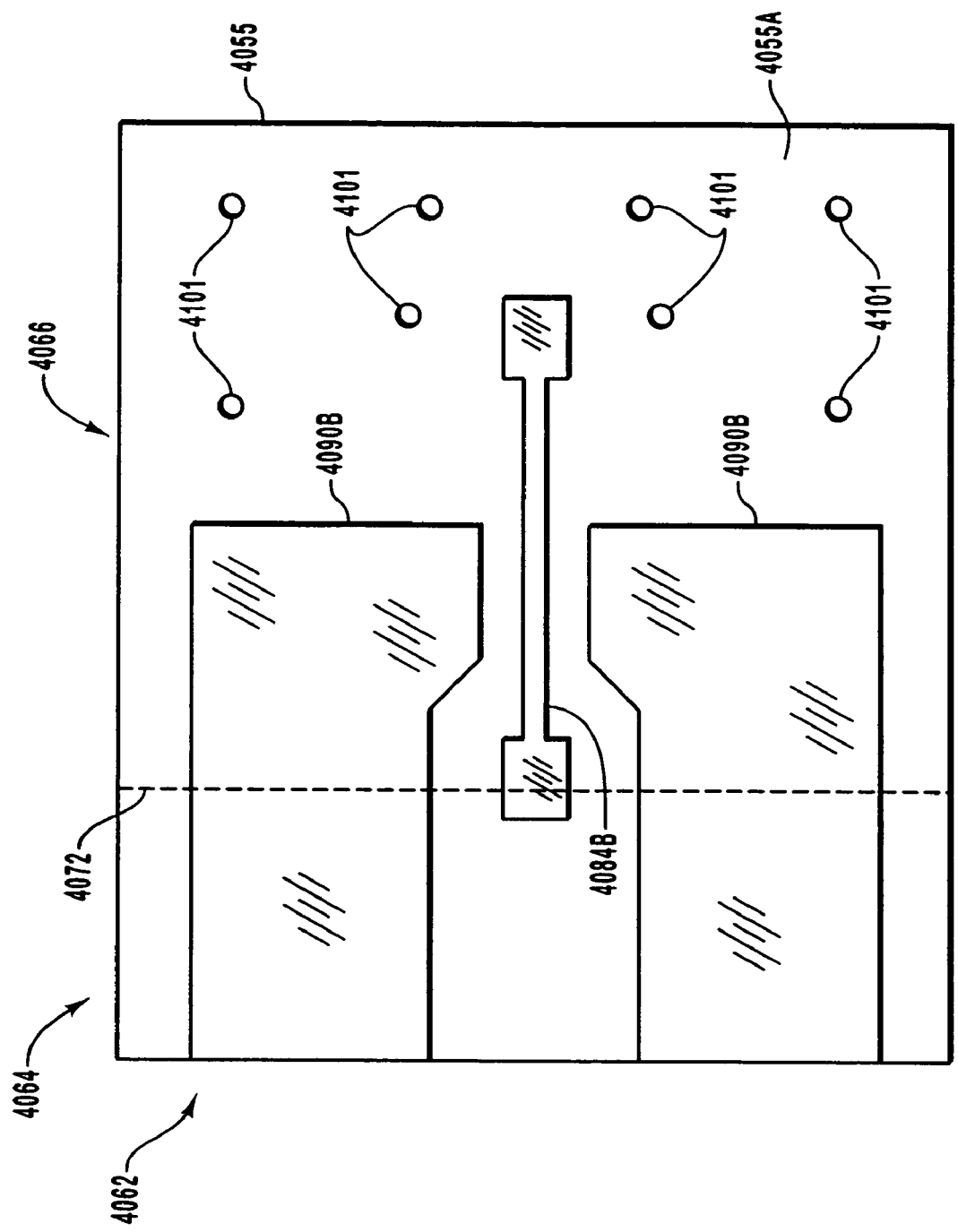
FIG. 14 is a top view of another layer of the multi-layer platform of the header assembly of FIG. 11A.

Reference is now made to FIG. 14, which illustrates various features of the present invention in connection with those features already described. In particular, a top surface 4055A of the lower intermediate layer 4055 is shown, having various conductive pathways 4062 defined thereon. Among these are two ground signal line portions 4090B located on the top surface 4055A. Each of the ground signal line portions 4090B is positioned on the lower intermediate layer top surface 4055A as to be directly below one of the respective high speed transmission lines 4070 and its adjacent ground signal line portions 4090A, both of which are located on the upper intermediate layer top surface 4050A. So positioned, the ground signal line portions 4090B act as ground planes for the high speed transmission lines 4070 which, as previously described, are configured as hybrid co-planar/microstrip traces on the upper intermediate layer top surface. This arrangement enables proper operation of the high speed transmission lines 4070. Each of the ground signal line portions 4090B is electrically interconnected with the ground signal line portions 4090A (located on the upper intermediate layer top surface 4050A) by the conductive vias 4091 (FIG. 13), or by other appropriate means.

Also shown on the lower intermediate layer top surface 4055A is an embedded signal line portion 408413. Used to interconnect the embedded signal contact pad 4084A with the embedded signal line portion 4084C, each of which is located on the upper intermediate layer 4050A, the embedded signal line portion 40841 includes terminal ends that are vertically aligned with and electrically connected to both the contact pad 4084A and the signal line portion 4084C by the conductive vias 4085 (FIG. 13). As such, one terminal end of the embedded signal line portion 4084B is positioned on the exterior portion 4066 of the lower intermediate layer 4055, while the other terminal end is located toward the interior portion thereof. Again, for clarity the exterior and interior portions are approximately delineated by the dashed line 4072.

Also seen on the top surface 4055A of the lower intermediate layer 4055 is the plurality of conductive vias 4101 that interconnect the cooling device signal line contact pads 4100A, located on the upper intermediate layer top surface 4050A, with other traces in the MLP 4030, as will be seen. In the illustrated embodiment, two conductive vias 4101 for each of the four cooling device signal line contact pads 4100A are defined through the upper intermediate layer 4050 and the lower intermediate layer 4055.

Figure 15:
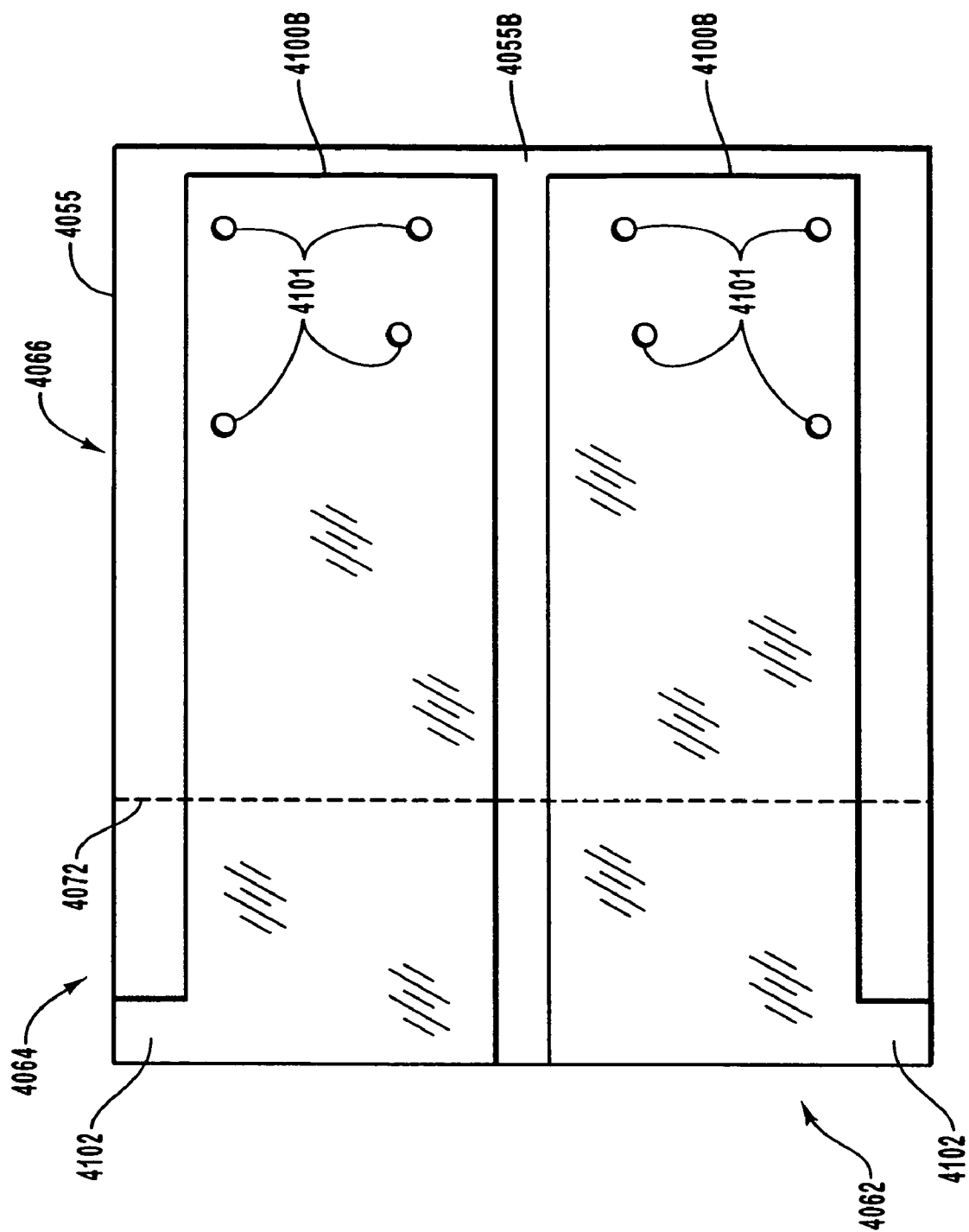
FIG. 15 is a bottom view of the layer in FIG. 14.

Reference is now made to FIG. 15, which illustrates further details regarding the lower intermediate layer 4055 of the MLP 4030. Specifically (and in contrast to FIG. 14, which shows the top surface of the lower intermediate layer), a bottom surface 4055B of the lower intermediate layer 4055 is shown, and includes two cooling device signal line portions 4100B located on the bottom surface and extending from the exterior portion 4066 to the interior portion 4064 thereof. As seen in FIG. 15, the edge of each cooling device signal line portion 4100B on the interior portion 4064 includes a flange 4102 that forms a contact surface for providing electrical connection between the signal line 4100 and the TEC or other cooling device. As mentioned, the conductive vias 4101 extend through both the upper intermediate layer 4050 and the lower intermediate layer 4055 to electrically connect the cooling device signal line contact pads 4100A on the upper intermediate layer top surface 4050A with the cooling device signal line portions 4100B on the lower intermediate layer bottom surface 4055B. The electrical signal carried in this arrangement can then be provided to a cooling device, such as a TEC located within the header assembly 4020 to enable cooling operations, or in some cases heating operations, to take place within the header assembly 4020 in order to maintain the temperatures of components disposed therein substantially constant.

Figure 16:
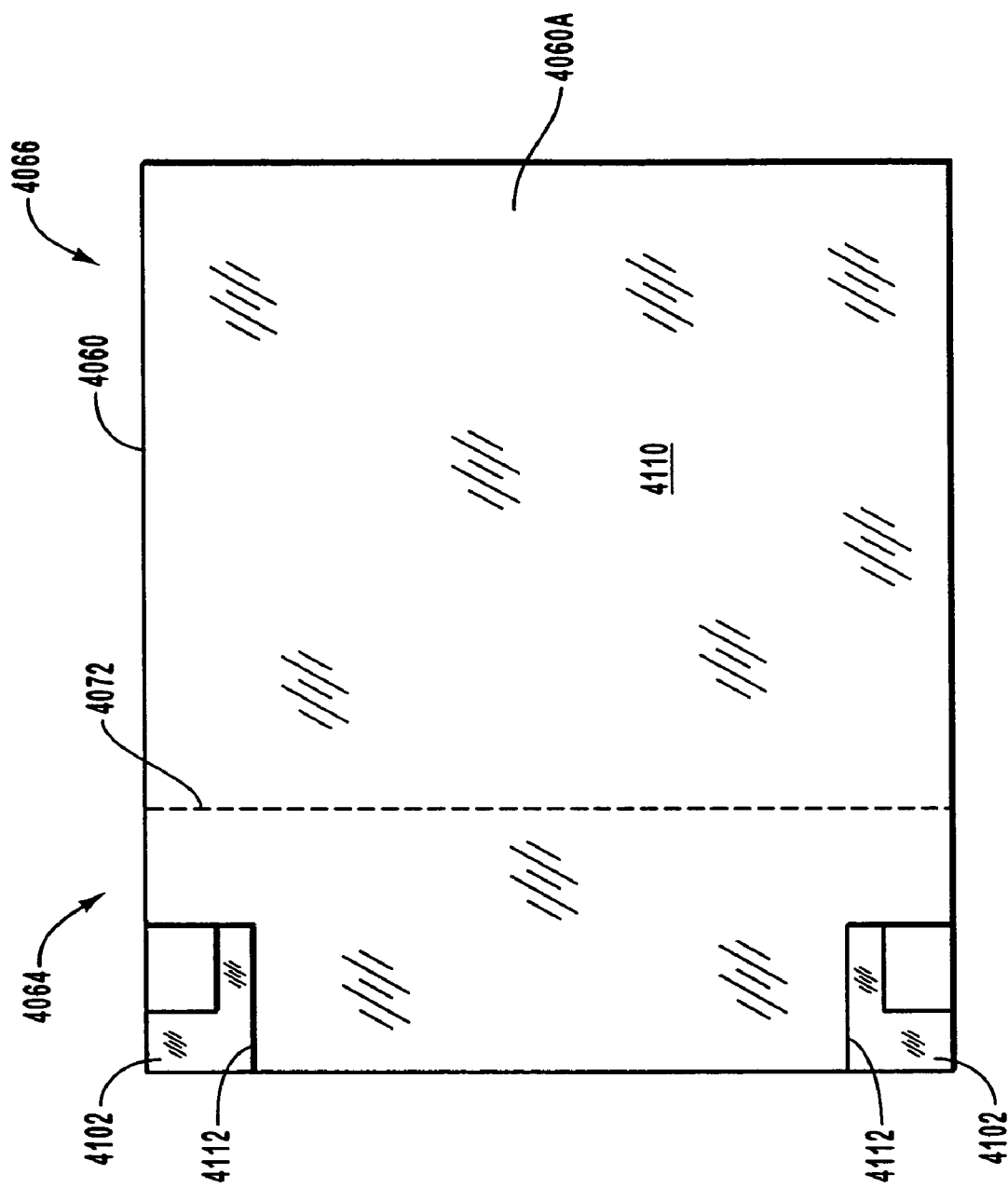
FIG. 16 is a bottom view of yet another layer of the multi-layer platform of the header assembly of FIG. 11A.

Reference is now made to FIG. 16, which depicts various features of the lower layer 4060 of the MLP 4030. A top surface (not shown) of the lower layer 4060 includes no conductive features in the present embodiment. The ceramic top surface of the lower layer 4060 therefore acts as a ceramic cover for the conductive pathways (i.e., the cooling device signal line portions 4100B) that are located on the bottom surface 4055B of the lower intermediate layer 4055, to which the lower layer is hermetically attached.

In alternative embodiments it is appreciated that various conductive features can be applied not only to the bottom surface 4055B of the lower intermediate layer, but to the top surface of the lower layer 4060 as well.

The lower layer 4060 also comprises a bottom surface 4060A that is substantially covered with a conductive covering material 4110, such as a tungsten alloy having a gold top plating. The conductive covering material 4110 allows the bottom surface 4060A of the lower layer 4060 to be electrically common with the base 4022 of the header assembly 4020 via the thermal slug 4024, thereby also making it common with the outer casing of the TOSA and the metal chassis of the optical transceiver (not shown) in which the header assembly 4020.is located. The conductive covering material 4110 as shown in FIG. 16 is not, however, electrically common with the ground or other signal lines described above in connection with this embodiment. Additionally, the conductive covering material 4110 cooperates with the metallization layer 4068 to enable the hermetic joining of the MLP 4030 to the base 4022.

It is noted here that, in addition to the role described above, the lower layer 4060 of the MLP 4030 also ensures electrical separation between the ground signals described earlier and the chassis ground of the optical transceiver in which the header assembly 4020 is located. Further, the lower layer 4060 can serve in some embodiments to improve electromagnetic interference and electro static discharge characteristics of the TOSA.

Two cutouts 4112 are also formed at the corners of the interior portion 4064 of the lower layer 4060. These cutouts 4112 expose the flange 4102 of each cooling device signal line portion 4100B on the lower intermediate layer bottom surface 4055B from below, thereby facilitating an electrical connection between each flange and the TEC or other cooling device using wire bonding or other appropriate connection means.

The embodiments of the multi-layer platform described herein in connection with FIGS. 7A–16 show platforms having three and four stacked layers, respectively. It is appreciated, however, that multi-layer platforms having two, five, or more stacked layers are also possible. Various considerations can influence the number of layers that a platform should have, including the electrical and geometrical requirements of the various conductive pathways to be included in the multi-layer platform and overall size restrictions imposed by the package into which the multi-layer platform is positioned. Also, while it is shown here as forming a part of a header assembly that is disposed within the TOSA of an optical transceiver module, the multi-layer platform of the present invention could alternatively be included as a component of other electronic devices as well.

In addition to the benefits derived from the present invention already described (i.e., allowance for a greater number of interconnects with the header assembly, and ability to include a greater variety of optoelectronic components within the header assembly), the multi-layer platform, by virtue of these benefits, allows for some functions that were formerly limited to components located outside of the header assembly to be brought inside the header assembly. For instance, in the TOSA of an optical transceiver module a drive integrated circuit that is typically positioned on a transceiver printed circuit board outside of the header assembly can, in one embodiment, be located on the submount within the header assembly. This results not only in overall power savings for the transceiver module, but also increases manufacturing efficiency while reducing the required size of the TOSA in which the header assembly is placed when compared to an optical transceiver configured with known header assembly interconnects.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An optical subassembly comprising:
    a header assembly comprising:
        a base; and
        a platform extending through the base and including a plurality of stacked platform layers and at least one conductive pathway, the at least one conductive pathway configured and arranged so as to extend through the base; and
    at least one optoelectronic component mounted at least indirectly to the platform of the header assembly.

2. The optical subassembly as recited in claim 1, wherein the at least one optoelectronic component comprises at least one of: a laser; and, a photodiode.

3. The optical subassembly as recited in claim 1, wherein the optical subassembly comprises a transmitter optical subassembly.

4. The optical subassembly as recited in claim 1, wherein the optical subassembly comprises a receiver optical subassembly.

5. The optical subassembly as recited in claim 1, wherein each of the stacked platform layers substantially comprises an insulative material.

6. The optical subassembly as recited in claim 1, wherein the at least one conductive pathway has a geometry that corresponds to a desired impedance.

7. The optical subassembly as recited in claim 1, wherein the at least one conductive pathway comprises an electrically conductive trace, at least a portion of which is patterned on a surface of at least one of the stacked layers.

8. The optical subassembly as recited in claim 1, wherein the platform is substantially hermetically sealed to the base.

9. The optical subassembly as recited in claim 1, wherein the plurality of stacked platform layers comprises:
    an upper insulating layer;
    an intermediate layer; and
    a lower layer.

10. The optical subassembly as recited in claim 1, wherein the at least one conductive pathway comprises at least one of each of the following:
    a high speed transmission line;
    a general signal line; and
    a ground signal line.

11. The optical subassembly as recited in claim 1, wherein the at least one conductive pathway is substantially embedded in one of the stacked layers.

12. The optical subassembly as recited in claim 1, wherein the at least one conductive pathway is located substantially on a single one of the stacked layers.

13. The optical subassembly as recited in claim 1, wherein different portions of the at least one conductive pathway are located on different respective stacked layers.

14. The optical subassembly as recited in claim 1, wherein the at least one conductive pathway electrically interconnects the at least one optoelectronic component with another component.

15. The optical subassembly as recited in claim 1, wherein one of the stacked platform layers comprises a sealing layer positioned to prevent electrical contact between the at least one conductive pathway and the base.

16. The optical subassembly as recited in claim 1, further comprising a metallization layer deposited on at least a portion of the platform so as to be interposed between the base and the platform.

17. The optical subassembly as recited in claim 1, further comprising a cap attached to the base and cooperating with the base to enclose at least a portion of the platform and the at least one optoelectronic component.

18. The optical subassembly as recited in claim 1, further comprising a submount attached to the platform and to which the at least one optoelectronic component is mounted.

19. The optical subassembly as recited in claim 18, wherein the submount is integral with the platform.

20. The optical subassembly as recited in claim 1, further comprising:
    an outer casing within which at least part of the header assembly is enclosed;
    an lens assembly located within the outer casing proximate the at least one optoelectronic component;
    an isolator interposed between the lens assembly and the at least one optoelectronic component;
    a receptacle connected to the outer casing and substantially aligned with the isolator; and
    a cap attached to the base and cooperating with the base to enclose the at least one optoelectronic component and a portion of the platform, the cap being located within the outer casing proximate the lens assembly.

* * * * *

UNITED STATES PATENT AND TRADEMARK OFFICE
CERTIFICATE OF CORRECTION

PATENT NO.       : 7,210,859 B2
APPLICATION NO.  : 10/979466
DATED            : May 1, 2007
INVENTOR(S)      : Kumar et al.

It is certified that error appears in the above-identified patent and that said Letters Patent is hereby corrected as shown below:

Column 12
Line 13, after "pathways", change "510" to --610--
Line 17, after "pathways", change "410" to --610--

Column 14
Line 19, change "mounted is directly" to --mounted directly--
Line 60, change "102" to --1002--

Column 17
Line 50, change "that, that" to --that--
Line 65, change "818" to --816--

Column 18
Line 66, after "feedthrough", remove [.]

Column 19
Line 12, change "1500" to --1100--

Column 30
Line 34, change "3066" to --4066--
Line 34, change "3064" to --4064--

Column 32
Line 2, change "a MLP" to --an MLP--

Column 33
Line 27, change "408413" to --4084B--
Line 31, change "40841" to --4084B--

Column 34
Line 31, after "4020", remove [.]

CERTIFICATE OF CORRECTION (continued)
U.S. Pat. No. 7,210,859 B2

Column 36
Line 48, change "an lens" to --a lens--

Signed and Sealed this

Twenty-third Day of March, 2010

David J. Kappos
*Director of the United States Patent and Trademark Office*